(12) United States Patent
Jeong et al.

(10) Patent No.: US 8,161,363 B2
(45) Date of Patent: Apr. 17, 2012

(54) APPARATUS AND METHOD TO ENCODE/DECODE BLOCK LOW DENSITY PARITY CHECK CODES IN A COMMUNICATION SYSTEM

(75) Inventors: Hong-Sil Jeong, Seoul (KR); Sung-Eun Park, Seoul (KR); Seung-Hoon Choi, Seoul (KR); Jae-Yoel Kim, Suwon-si (KR); Se-Ho Myung, Daejeon (KR); Kyeong-Cheol Yang, Seoul (KR); Hyun-Koo Yang, Seoul (KR)

(73) Assignee: Samsung Electronics Co., Ltd (KR)

( * ) Notice: Subject to any disclaimer, the term of this patent is extended or adjusted under 35 U.S.C. 154(b) by 1168 days.

(21) Appl. No.: 11/999,496

(22) Filed: Dec. 4, 2007

(65) Prior Publication Data

US 2008/0155385 A1  Jun. 26, 2008

(30) Foreign Application Priority Data

Dec. 4, 2006 (KR) ........................ 10-2006-0121830
Jun. 28, 2007 (KR) ........................ 10-2007-0064585

(51) Int. Cl.
*G06F 11/00* (2006.01)
*H03M 13/00* (2006.01)

(52) U.S. Cl. ........................ 714/801; 714/755

(58) Field of Classification Search .................. 714/755, 714/801, 786, 738, 781, 776, 804
See application file for complete search history.

(56) References Cited

U.S. PATENT DOCUMENTS

| | | | | |
|---|---|---|---|---|
| 7,093,179 B2* | 8/2006 | Shea | | 714/755 |
| 7,502,983 B2* | 3/2009 | Massey | | 714/755 |
| 7,526,717 B2* | 4/2009 | Kyung et al. | | 714/800 |
| 7,779,331 B2* | 8/2010 | Tan | | 714/758 |
| 7,783,952 B2* | 8/2010 | Nimbalker et al. | | 714/755 |
| 7,802,163 B2* | 9/2010 | Tan | | 714/752 |
| 7,984,364 B2* | 7/2011 | Park et al. | | 714/781 |
| 8,020,062 B2* | 9/2011 | Jeong et al. | | 714/752 |
| 2008/0028273 A1* | 1/2008 | Jeong et al. | | 714/752 |
| 2008/0140686 A1* | 6/2008 | Hong et al. | | 707/100 |
| 2008/0263431 A1* | 10/2008 | Jeong et al. | | 714/801 |

* cited by examiner

*Primary Examiner* — Phung M Chung
(74) *Attorney, Agent, or Firm* — The Farrell Law Firm, P.C.

(57) ABSTRACT

An apparatus and method to encode a block Low Density Parity Check (LDPC) code in a signal transmission apparatus is disclosed. The method includes generating a first block LDPC codeword by encoding an information vector using a first parity check matrix when a code rate to be used in the signal transmission apparatus is a first code rate as a code rate of the first parity check matrix, and generating a second block LDPC codeword by encoding the information vector using a second parity check matrix when the code rate to be used in the signal transmission apparatus is a second code rate as a code rate of the second parity check matrix.

75 Claims, 23 Drawing Sheets

| $P^{a_1}$ | 1 | 0 | 0 | 0 |
|---|---|---|---|---|
| ⋮ | $P^{a_2}$ | 1 | 0 | 0 |
| $P^y$ | 0 | $P^{a_3}$ | 1 | 0 |
| ⋮ | ⋮ | ⋮ | ⋮ | 1 |
| $P^x$ | 0 | 0 | 0 | $P^{a_m}$ |

PARITY PART

| $P^{a_{11}}$ | $P^{a_{12}}$ | $P^{a_{13}}$ | $P^{a_{14}}$ | ⋯ | $P^{a_{1(n-1)}}$ | $P^{a_{1n}}$ |
| $P^{a_{21}}$ | $P^{a_{22}}$ | $P^{a_{23}}$ | $P^{a_{24}}$ | ⋯ | $P^{a_{2(n-1)}}$ | $P^{a_{2n}}$ |
| $P^{a_{31}}$ | $P^{a_{32}}$ | $P^{a_{33}}$ | $P^{a_{34}}$ | ⋯ | $P^{a_{3(n-1)}}$ | $P^{a_{3n}}$ |
| ⋯ | ⋯ | ⋯ | ⋯ | ⋯ | ⋯ | ⋯ |
| $P^{a_{m1}}$ | $P^{a_{m2}}$ | $P^{a_{m3}}$ | $P^{a_{m4}}$ | ⋯ | $P^{a_{m(n-1)}}$ | $P^{a_{mn}}$ |

INFORMATION PART

FIG.3

$$B^T = \begin{bmatrix} P^{a_1} & 0 & \cdots & P^\gamma & \cdots & 0 & 0 \end{bmatrix}$$

$$T = \begin{bmatrix} 1 & 0 & 0 & \cdots & 0 & 0 \\ P^{a_2} & 1 & 0 & \cdots & 0 & 0 \\ 0 & P^{a_3} & 1 & \cdots & 0 & 0 \\ \vdots & \vdots & \vdots & & \vdots & \vdots \\ 0 & 0 & 0 & \cdots & P^{a_{m-2}} & 0 \\ 0 & 0 & 0 & \cdots & 1 & P^{a_{m-1}} \\ 0 & 0 & 0 & \cdots & 0 & 1 \end{bmatrix}$$

$$E = \begin{bmatrix} 0 & 0 & 0 & \cdots & 0 & 0 & P^{a_m} \end{bmatrix}$$

$$T^{-1} = \begin{bmatrix} 1 & 0 & 0 & \cdots & P^{2\sim(m-2)} & P^{2\sim(m-1)} \\ P^{a_2} & 1 & 0 & \cdots & P^{3\sim(m-2)} & P^{3\sim(m-1)} \\ P^{2\sim3} & P^{a_3} & 1 & \cdots & P^{4\sim(m-2)} & P^{4\sim(m-1)} \\ \vdots & \vdots & \vdots & & \vdots & \vdots \\ 0 & 0 & 0 & \cdots & P^{a_{m-2}} & P^{(m-2)(m-1)} \\ 0 & 0 & 0 & \cdots & 1 & P^{a_{m-1}} \\ 0 & 0 & 0 & \cdots & 0 & 1 \end{bmatrix}$$

FIG.5

$$A1 = \begin{array}{|c|c|c|c|} \hline 17 & -1 & -1 & -1 \\ \hline -1 & 10 & -1 & -1 \\ \hline 4 & -1 & 4 & -1 \\ \hline -1 & 38 & -1 & 7 \\ \hline -1 & -1 & 18 & -1 \\ \hline 60 & -1 & -1 & -1 \\ \hline -1 & 5 & -1 & -1 \\ \hline -1 & -1 & -1 & 32 \\ \hline -1 & -1 & 64 & -1 \\ \hline \end{array}$$

FIG.12A $$A2 = \begin{array}{|c|c|c|c|c|c|c|} \hline 5 & -1 & -1 & -1 & 12 & -1 & -1 \\ \hline -1 & 15 & -1 & -1 & -1 & 3 & -1 \\ \hline -1 & -1 & 6 & -1 & -1 & -1 & 11 \\ \hline -1 & -1 & -1 & 7 & 75 & -1 & -1 \\ \hline -1 & -1 & 1 & -1 & -1 & 16 & -1 \\ \hline -1 & 45 & -1 & 45 & -1 & -1 & -1 \\ \hline 29 & -1 & -1 & -1 & -1 & -1 & 62 \\ \hline -1 & -1 & 0 & -1 & 38 & -1 & -1 \\ \hline 20 & -1 & -1 & 0 & -1 & 40 & -1 \\ \hline \end{array}$$

FIG.12E $$F = \begin{array}{|c|c|c|c|} \hline -1 & 42 & 67 & -1 \\ \hline 37 & 78 & -1 & 1 \\ \hline 34 & -1 & 79 & 40 \\ \hline -1 & 0 & 32 & -1 \\ \hline 3 & 32 & -1 & 40 \\ \hline \end{array}$$

FIG.12F $$G = \begin{array}{|c|c|c|c|c|c|c|} \hline -1 & -1 & -1 & 0 & -1 & -1 & -1 \\ \hline -1 & -1 & -1 & -1 & -1 & -1 & -1 \\ \hline -1 & -1 & -1 & -1 & -1 & -1 & -1 \\ \hline -1 & -1 & 0 & -1 & -1 & -1 & -1 \\ \hline -1 & -1 & -1 & -1 & -1 & -1 & -1 \\ \hline \end{array}$$

FIG.12G $$H = \begin{array}{|c|c|c|c|c|} \hline 0 & -1 & -1 & -1 & -1 \\ \hline -1 & 0 & -1 & -1 & -1 \\ \hline -1 & -1 & 0 & -1 & -1 \\ \hline -1 & -1 & -1 & 0 & -1 \\ \hline -1 & -1 & -1 & -1 & 0 \\ \hline \end{array}$$

FIG.12H $$A1 = \begin{array}{|c|c|c|c|c|c|c|}
\hline
0 & -1 & -1 & -1 & -1 & -1 & -1 \\
\hline
-1 & 0 & -1 & -1 & -1 & -1 & -1 \\
\hline
-1 & -1 & 0 & -1 & -1 & -1 & -1 \\
\hline
-1 & -1 & -1 & 0 & -1 & -1 & -1 \\
\hline
-1 & -1 & -1 & -1 & 0 & -1 & -1 \\
\hline
-1 & -1 & -1 & -1 & -1 & 0 & -1 \\
\hline
-1 & -1 & -1 & -1 & -1 & -1 & 0 \\
\hline
-1 & 74 & -1 & -1 & -1 & -1 & -1 \\
\hline
-1 & -1 & -1 & -1 & 8 & -1 & -1 \\
\hline
-1 & -1 & -1 & 58 & -1 & -1 & -1 \\
\hline
-1 & -1 & 7 & -1 & -1 & -1 & -1 \\
\hline
-1 & -1 & -1 & -1 & -1 & 18 & -1 \\
\hline
76 & -1 & -1 & -1 & -1 & -1 & -1 \\
\hline
-1 & -1 & -1 & 39 & -1 & -1 & -1 \\
\hline
-1 & -1 & -1 & -1 & -1 & -1 & -1 \\
\hline
-1 & -1 & -1 & -1 & 42 & -1 & -1 \\
\hline
-1 & 63 & -1 & -1 & -1 & -1 & -1 \\
\hline
-1 & -1 & 56 & -1 & -1 & -1 & -1 \\
\hline
34 & -1 & -1 & -1 & -1 & -1 & -1 \\
\hline
-1 & -1 & -1 & -1 & -1 & -1 & 53 \\
\hline
-1 & -1 & -1 & -1 & -1 & 71 & -1 \\
\hline
\end{array}$$

| 0 | -1 | -1 | -1 | -1 | -1 | -1 | -1 | 0 | -1 | -1 | -1 | -1 | -1 | -1 |
|---|---|---|---|---|---|---|---|---|---|---|---|---|---|---|
| -1 | 0 | -1 | -1 | -1 | -1 | -1 | -1 | -1 | 0 | -1 | -1 | -1 | -1 | -1 |
| -1 | -1 | 0 | -1 | -1 | -1 | -1 | -1 | -1 | -1 | 0 | -1 | -1 | -1 | -1 |
| -1 | -1 | -1 | 0 | -1 | -1 | -1 | -1 | -1 | -1 | -1 | 0 | -1 | -1 | -1 |
| -1 | -1 | -1 | -1 | 0 | -1 | -1 | -1 | -1 | -1 | -1 | -1 | 0 | -1 | -1 |
| -1 | -1 | -1 | -1 | -1 | 0 | -1 | -1 | -1 | -1 | -1 | -1 | -1 | 0 | -1 |
| -1 | -1 | -1 | -1 | -1 | -1 | 0 | -1 | -1 | -1 | -1 | -1 | -1 | -1 | 0 |
| -1 | -1 | -1 | -1 | -1 | -1 | -1 | 0 | -1 | -1 | -1 | -1 | 23 | -1 | -1 |
| -1 | -1 | 77 | -1 | -1 | -1 | -1 | -1 | 46 | -1 | -1 | -1 | -1 | -1 | -1 |
| -1 | 64 | -1 | -1 | -1 | -1 | -1 | -1 | -1 | -1 | -1 | -1 | -1 | 25 | -1 |
| -1 | -1 | -1 | -1 | -1 | -1 | -1 | 1 | -1 | -1 | -1 | 2 | -1 | -1 | -1 |
| -1 | -1 | -1 | -1 | 10 | -1 | -1 | -1 | -1 | -1 | -1 | -1 | -1 | -1 | 76 |
| -1 | -1 | -1 | -1 | -1 | 63 | -1 | -1 | -1 | -1 | 29 | -1 | -1 | -1 | -1 |
| 71 | -1 | -1 | -1 | -1 | -1 | -1 | 24 | -1 | -1 | -1 | -1 | -1 | -1 | -1 |
| -1 | -1 | -1 | -1 | -1 | -1 | 45 | -1 | -1 | 20 | -1 | 13 | -1 | -1 | -1 |
| -1 | 72 | -1 | -1 | -1 | -1 | -1 | -1 | -1 | -1 | -1 | -1 | -1 | -1 | 1 |
| -1 | -1 | -1 | 0 | -1 | 76 | -1 | -1 | -1 | -1 | -1 | -1 | -1 | -1 | -1 |
| 1 | -1 | -1 | -1 | 54 | -1 | -1 | -1 | -1 | -1 | -1 | -1 | -1 | -1 | -1 |
| -1 | -1 | -1 | -1 | -1 | -1 | -1 | -1 | -1 | 37 | -1 | -1 | -1 | 39 | -1 |
| -1 | -1 | -1 | 29 | -1 | -1 | -1 | -1 | 2 | -1 | -1 | -1 | -1 | -1 | -1 |
| -1 | -1 | 14 | -1 | -1 | -1 | 52 | -1 | -1 | -1 | -1 | -1 | -1 | -1 | -1 |

| T= | 0 | -1 | -1 | -1 | -1 | -1 | -1 | -1 | -1 | -1 | -1 | -1 | -1 | -1 | -1 | -1 | -1 | -1 | -1 | -1 | -1 |
|---|---|---|---|---|---|---|---|---|---|---|---|---|---|---|---|---|---|---|---|---|---|
| | 0 | 0 | -1 | -1 | -1 | -1 | -1 | -1 | -1 | -1 | -1 | -1 | -1 | -1 | -1 | -1 | -1 | -1 | -1 | -1 | -1 |
| | -1 | 0 | 0 | -1 | -1 | -1 | -1 | -1 | -1 | -1 | -1 | -1 | -1 | -1 | -1 | -1 | -1 | -1 | -1 | -1 | -1 |
| | -1 | -1 | 0 | 0 | -1 | -1 | -1 | -1 | -1 | -1 | -1 | -1 | -1 | -1 | -1 | -1 | -1 | -1 | -1 | -1 | -1 |
| | -1 | -1 | -1 | 0 | 0 | -1 | -1 | -1 | -1 | -1 | -1 | -1 | -1 | -1 | -1 | -1 | -1 | -1 | -1 | -1 | -1 |
| | -1 | -1 | -1 | -1 | 0 | 0 | -1 | -1 | -1 | -1 | -1 | -1 | -1 | -1 | -1 | -1 | -1 | -1 | -1 | -1 | -1 |
| | -1 | -1 | -1 | -1 | -1 | 0 | 0 | -1 | -1 | -1 | -1 | -1 | -1 | -1 | -1 | -1 | -1 | -1 | -1 | -1 | -1 |
| | -1 | -1 | -1 | -1 | -1 | -1 | 0 | 0 | -1 | -1 | -1 | -1 | -1 | -1 | -1 | -1 | -1 | -1 | -1 | -1 | -1 |
| | -1 | -1 | -1 | -1 | -1 | -1 | -1 | 0 | 0 | -1 | -1 | -1 | -1 | -1 | -1 | -1 | -1 | -1 | -1 | -1 | -1 |
| | -1 | -1 | -1 | -1 | -1 | -1 | -1 | -1 | 0 | 0 | -1 | -1 | -1 | -1 | -1 | -1 | -1 | -1 | -1 | -1 | -1 |
| | -1 | -1 | -1 | -1 | -1 | -1 | -1 | -1 | -1 | 0 | 0 | -1 | -1 | -1 | -1 | -1 | -1 | -1 | -1 | -1 | -1 |
| | -1 | -1 | -1 | -1 | -1 | -1 | -1 | -1 | -1 | -1 | 0 | 0 | -1 | -1 | -1 | -1 | -1 | -1 | -1 | -1 | -1 |
| | -1 | -1 | -1 | -1 | -1 | -1 | -1 | -1 | -1 | -1 | -1 | 0 | 0 | -1 | -1 | -1 | -1 | -1 | -1 | -1 | -1 |
| | -1 | -1 | -1 | -1 | -1 | -1 | -1 | -1 | -1 | -1 | -1 | -1 | 0 | 0 | -1 | -1 | -1 | -1 | -1 | -1 | -1 |
| | -1 | -1 | -1 | -1 | -1 | -1 | -1 | -1 | -1 | -1 | -1 | -1 | -1 | 0 | 0 | -1 | -1 | -1 | -1 | -1 | -1 |
| | -1 | -1 | -1 | -1 | -1 | -1 | -1 | -1 | -1 | -1 | -1 | -1 | -1 | -1 | 0 | 0 | -1 | -1 | -1 | -1 | -1 |
| | -1 | -1 | -1 | -1 | -1 | -1 | -1 | -1 | -1 | -1 | -1 | -1 | -1 | -1 | -1 | 0 | 0 | -1 | -1 | -1 | -1 |
| | -1 | -1 | -1 | -1 | -1 | -1 | -1 | -1 | -1 | -1 | -1 | -1 | -1 | -1 | -1 | -1 | 0 | 0 | -1 | -1 | -1 |
| | -1 | -1 | -1 | -1 | -1 | -1 | -1 | -1 | -1 | -1 | -1 | -1 | -1 | -1 | -1 | -1 | -1 | 0 | 0 | -1 | -1 |
| | -1 | -1 | -1 | -1 | -1 | -1 | -1 | -1 | -1 | -1 | -1 | -1 | -1 | -1 | -1 | -1 | -1 | -1 | 0 | 0 | -1 |
| | -1 | -1 | -1 | -1 | -1 | -1 | -1 | -1 | -1 | -1 | -1 | -1 | -1 | -1 | -1 | -1 | -1 | -1 | -1 | 0 | 0 |

| 26 | 51 | -1 | -1 | -1 | -1 | 50 |
|---|---|---|---|---|---|---|
| -1 | 13 | -1 | -1 | 1 | 51 | -1 |
| 6 | -1 | 70 | -1 | 29 | -1 | -1 |
| 19 | -1 | -1 | 44 | -1 | -1 | 55 |
| -1 | 34 | -1 | 50 | 19 | -1 | -1 |
| -1 | -1 | 43 | 68 | -1 | 31 | -1 |
| -1 | -1 | 16 | -1 | -1 | 66 | 61 |

| -1 | -1 | -1 | -1 | -1 | -1 | -1 | -1 | -1 | -1 | -1 | -1 | -1 | -1 |
|---|---|---|---|---|---|---|---|---|---|---|---|---|---|
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |

H =

| 0 | -1 | -1 | -1 | -1 | -1 | -1 |
|---|---|---|---|---|---|---|
| -1 | 0 | -1 | -1 | -1 | -1 | -1 |
| -1 | -1 | 0 | -1 | -1 | -1 | -1 |
| -1 | -1 | -1 | 0 | -1 | -1 | -1 |
| -1 | -1 | -1 | -1 | 0 | -1 | -1 |
| -1 | -1 | -1 | -1 | -1 | 0 | -1 |
| -1 | -1 | -1 | -1 | -1 | -1 | 0 |

| 0 | -1 |
|---|---|
| -1 | 0 |
| 137 | 14 |
| 130 | 165 |
| 163 | 120 |
| 145 | 94 |

A2 =

| 0 | 0 | 0 | 0 | 0 | 0 | 0 | 0 | 0 | 0 | -1 | -1 | -1 | -1 | -1 | -1 | -1 | -1 | -1 | -1 | -1 | -1 | -1 |
|---|---|---|---|---|---|---|---|---|---|---|---|---|---|---|---|---|---|---|---|---|---|---|
| -1 | -1 | -1 | -1 | -1 | -1 | -1 | -1 | -1 | -1 | 0 | 0 | 0 | 0 | 0 | 0 | 0 | 0 | 0 | 0 | -1 | -1 | -1 |
| 4 | 121 | 29 | 105 | -1 | -1 | -1 | -1 | -1 | -1 | 120 | 159 | 57 | -1 | -1 | -1 | -1 | -1 | -1 | -1 | 0 | 0 | 0 |
| -1 | -1 | -1 | -1 | 157 | 168 | 38 | 171 | -1 | -1 | -1 | -1 | -1 | 59 | 123 | 75 | 133 | -1 | -1 | -1 | 156 | -1 | -1 |
| 68 | 115 | -1 | -1 | -1 | -1 | -1 | -1 | 70 | 134 | 160 | 57 | -1 | -1 | -1 | -1 | -1 | 5 | 129 | 107 | -1 | 56 | -1 |
| -1 | -1 | 76 | 48 | 126 | 22 | -1 | -1 | -1 | -1 | -1 | -1 | 36 | 70 | 165 | 95 | -1 | -1 | -1 | -1 | 90 | -1 | 159 |

| 0 | -1 | -1 | -1 | -1 | -1 |
|---|---|---|---|---|---|
| 0 | 0 | -1 | -1 | -1 | -1 |
| -1 | 0 | 0 | -1 | -1 | -1 |
| -1 | -1 | 0 | 0 | -1 | -1 |
| -1 | -1 | -1 | 0 | 0 | -1 |
| -1 | -1 | -1 | -1 | 0 | 0 |

C2 =

| -1 | -1 | -1 | -1 | -1 | -1 | 111 | 49 | 103 | 173 | -1 | -1 | -1 | -1 | -1 | -1 | 151 | 119 | 123 | 100 | -1 | 127 | 85 |
|---|---|---|---|---|---|---|---|---|---|---|---|---|---|---|---|---|---|---|---|---|---|---|

| 0 | 0 | 0 | 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---|---|---|---|
| -1 | -1 | -1 | -1 | -1 | -1 | -1 | -1 | -1 | -1 | -1 | -1 | -1 | -1 | -1 | -1 | -1 | -1 |
| 8 | 172 | 75 | 65 | 171 | 28 | 113 | 89 | -1 | -1 | -1 | -1 | -1 | -1 | -1 | -1 | -1 | -1 |
| -1 | -1 | -1 | -1 | -1 | -1 | -1 | -1 | 122 | 59 | 85 | 126 | 158 | 40 | 5 | 150 | | |
| 127 | 86 | -1 | -1 | -1 | -1 | -1 | -1 | 64 | 44 | -1 | -1 | -1 | -1 | -1 | -1 | | |
| -1 | -1 | 16 | 46 | 35 | -1 | -1 | -1 | -1 | -1 | 89 | 21 | 49 | 161 | -1 | -1 | | |

| 0 | 0 | 0 | 0 | 0 | 0 | 0 | -1 | -1 | -1 | -1 | -1 | -1 | -1 | -1 | -1 | -1 | -1 |
|---|---|---|---|---|---|---|---|---|---|---|---|---|---|---|---|---|---|
| -1 | -1 | -1 | -1 | -1 | -1 | -1 | 0 | 0 | 0 | 0 | 0 | 0 | 0 | 0 | 0 | 0 | 0 |
| -1 | -1 | -1 | -1 | -1 | -1 | -1 | 22 | 64 | 74 | 37 | 170 | 42 | 33 | 63 | -1 | -1 | -1 |
| 20 | -1 | -1 | -1 | -1 | -1 | -1 | -1 | -1 | -1 | -1 | -1 | -1 | -1 | -1 | 171 | 89 | 72 |
| -1 | 13 | 79 | 90 | 36 | 151 | 157 | 48 | 67 | -1 | -1 | -1 | -1 | -1 | -1 | 28 | 33 | -1 |
| -1 | 28 | 128 | 102 | -1 | -1 | -1 | -1 | -1 | 105 | 83 | 98 | -1 | -1 | -1 | -1 | -1 | 158 |

| -1 | -1 | -1 | -1 | -1 | -1 | -1 | -1 | -1 | -1 | -1 | -1 | -1 | -1 | -1 | -1 | -1 | -1 |
|---|---|---|---|---|---|---|---|---|---|---|---|---|---|---|---|---|---|
| 0 | 0 | 0 | 0 | 0 | 0 | 0 | 0 | 0 | 0 | 0 | 0 | -1 | -1 | -1 | -1 | -1 | -1 |
| -1 | -1 | -1 | -1 | -1 | -1 | -1 | -1 | -1 | -1 | -1 | -1 | 0 | 0 | 0 | 0 | 0 | 0 |
| 80 | 14 | 156 | 46 | 139 | 11 | -1 | -1 | -1 | -1 | -1 | -1 | 40 | 99 | 120 | 73 | -1 | -1 |
| -1 | -1 | -1 | -1 | -1 | -1 | 55 | 9 | 54 | 169 | 18 | 118 | -1 | -1 | -1 | -1 | 115 | 56 | 110 |
| 145 | 6 | -1 | -1 | -1 | -1 | 124 | 20 | 71 | -1 | -1 | -1 | 135 | 137 | -1 | -1 | 55 | 175 | -1 |

| -1 | -1 | -1 | -1 | -1 | 124 | 119 | 126 | -1 | -1 | -1 | -1 | -1 | -1 | 85 | 149 |

| 136 | -1 | -1 | -1 | 144 | 141 | 52 | -1 | -1 | -1 | -1 | -1 | 24 | 95 | 151 | -1 | -1 | -1 | -1 |

| -1 | 5 | 77 | 109 | 14 | -1 | -1 | -1 | 66 | 25 | 122 | -1 | -1 | 78 | 82 | -1 | -1 | 147 |

FIG.16B

APPARATUS AND METHOD TO ENCODE/DECODE BLOCK LOW DENSITY PARITY CHECK CODES IN A COMMUNICATION SYSTEM

PRIORITY

This application claims priority under 35 U.S.C. §119(a) to Korean Patent Applications filed in the Korean Intellectual Property Office on Dec. 4, 2006 and assigned Serial No. 2006-121830, and filed in the Korean Intellectual Property Office on Jun. 28, 2007 and assigned Serial No. 2007-64585, the contents of each of which are incorporated herein by reference.

BACKGROUND OF THE INVENTION

1. Field of the Invention

The present invention relates generally to a communication system, and in particular, to an apparatus and method to encode/decode block Low Density Parity Check (LDPC) codes.

2. Description of the Related Art

The next generation communication system has evolved into a packet service communication system, which is a system for transmitting burst packet data to a plurality of mobile stations, and is suitable for high-capacity data transmission. In order to increase the data throughput, a Hybrid Automatic Retransmission reQuest (HARQ) scheme and an Adaptive Modulation and Coding (AMC) scheme have been proposed. In order to use the HARQ scheme and the AMC scheme, the next generation communication system must support a variable code rate.

Generally, block LDPC codes, together with turbo codes, have high performance gain during high-speed data transmission and effectively correct errors caused by noise generated in a transmission channel, contributing to an increase in the reliability of the data transmission.

However, block LDPC codes are disadvantageous because they have a relatively high code rate, and are limited in terms of the code rate. Among the currently available block LDPC codes, the major block LDPC codes have a code rate of 1/2 and only minor block LDPC codes have a code rate of 1/3. The limitation in the code rate exerts a fatal influence on the high-speed, high-capacity data transmission. Although a degree of distribution representing the optimal performance can be calculated using a density evolution scheme in order to implement a relatively low code rate for block LDPC codes, it is difficult to implement a block LDPC code having a degree of distribution representing the optimal performance due to various restrictions, such as a cycle structure in a factor graph and hardware implementation.

In view of the code rate limitations for block LDPC codes, it is necessary to support a variable code rate, from low code rate to high low code rate, in order to transmit/receive signals.

SUMMARY OF THE INVENTION

An aspect of the present invention is to substantially solve at least the above problems and/or disadvantages and to provide at least the advantages below. Accordingly, one aspect of the present invention is to provide an apparatus and method to encode/decode block Low Density Parity Check (LDPC) codes in a communication system.

According to another aspect of the present invention, there is provided a signal transmission/reception apparatus and method to generate a parity check matrix of a block LDPC code in a communication system.

According to one aspect of the present invention, there is provided an apparatus and method to encode a block Low Density Parity Check (LDPC) code in a signal transmission apparatus. The method includes generating a first block LDPC codeword by encoding an information vector using a first parity check matrix when a code rate to be used in the signal transmission apparatus is a first code rate as a code rate of the first parity check matrix, and generating a second block LDPC codeword by encoding the information vector using a second parity check matrix when the code rate to be used in the signal transmission apparatus is a second code rate as a code rate of the second parity check matrix.

BRIEF DESCRIPTION OF THE DRAWINGS

The above and other objects, features and advantages of the present invention will become more apparent from the following detailed description when taken in conjunction with the accompanying drawings in which:

FIG. 3 is a diagram illustrating a parity check matrix of a block LDPC code according to the present invention;

FIG. 5 is a diagram illustrating a transpose matrix of the partial matrix B illustrated in FIG. 4, the partial matrix E illustrated in FIG. 4, the partial matrix T illustrated in FIG. 4 and an inverse matrix of the partial matrix T illustrated in FIG. 4;

Figures 12C, 12D, 12E:
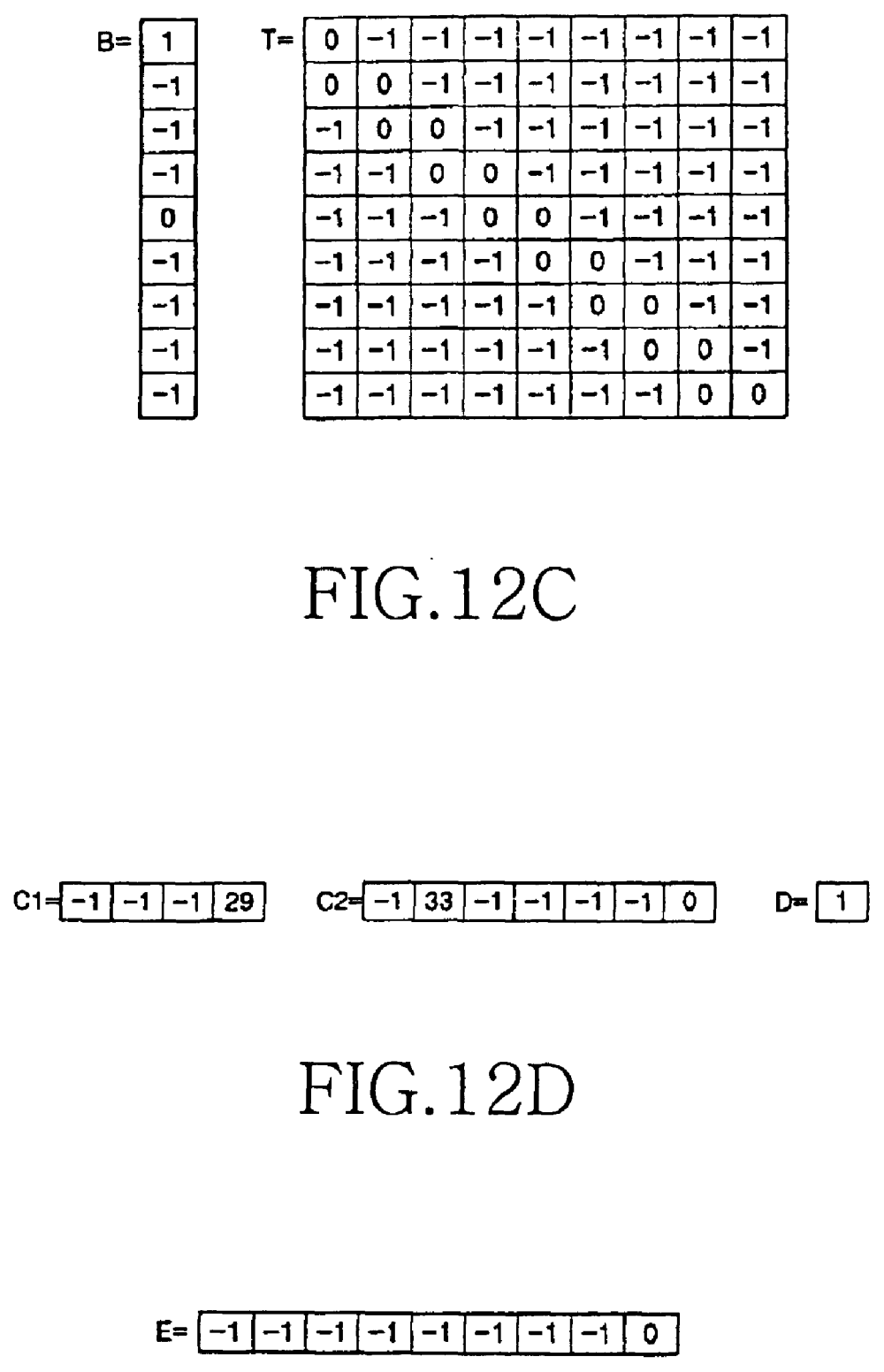

FIGS. 12A-12H are diagrams illustrating one example of a matrix arranged in each of partial blocks included in a parity check matrix of a first type semi-systematic block LDPC code according to the present invention when a code rate is 1/2;

FIGS. 13A-13G are diagrams illustrating another example of a matrix arranged in each of partial blocks included in a parity check matrix of a first type semi-systematic block LDPC code according to the present invention when a code rate is 1/2;

FIGS. 14A-14B are diagrams illustrating one example of a matrix arranged in each of partial blocks included in a parity check matrix of a second type semi-systematic block LDPC code according to the present invention when a code rate is 5/6;

FIGS. 15A-15C are diagrams illustrating one example of a matrix arranged in each of partial blocks included in a parity check matrix of a second type semi-systematic block LDPC code according to the present invention when a code rate is 11/12;

FIGS. 16A-16B are diagrams illustrating further another example of a matrix arranged in each of partial blocks included in a parity check matrix of a first type semi-systematic block LDPC code according to the present invention when a code rate is 1/2.

DETAILED DESCRIPTION OF THE PREFERRED EMBODIMENTS

Preferred embodiments of the present invention will now be described in detail with reference to the annexed drawings. In the following description, a detailed description of known functions and configurations incorporated herein has been omitted for the sake of clarity and conciseness.

The present invention discloses an apparatus and method to transmit and receive signals supporting a variable code rate in a communication system using a block Low Density Parity Check (LDPC) code. That is, the present invention provides an apparatus and method to transmit/receive signals using a parent parity check matrix supporting various code rates in a communication system using an LDPC code, with minimized encoding complexity.

In the next generation communication system, in order to increase the data throughput, a Hybrid Automatic Retransmission reQuest (HARQ) scheme and an Adaptive Modulation and Coding (AMC) scheme have been proposed. In order to use the HARQ scheme and the AMC scheme, the next generation communication system has to support a variable code rate.

Further, the next generation communication systems are considering a block LDPC code. Generally, there is a limitation in a code rate of a block LDPC code. The present invention provides an apparatus and method to transmit and receive a signal supporting a plurality of code rates in a communication system using a block LDPC code.

Figure 1:
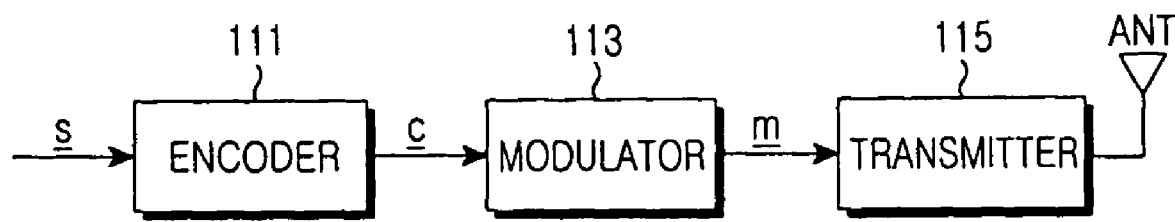
FIG. 1 is a block diagram illustrating the structure of a signal transmission apparatus according to the present invention.

FIG. 1 is a block diagram illustrating the structure of a signal transmission apparatus according to the present invention.

In FIG. 1, the signal transmission apparatus according to the present invention includes an encoder 111, a modulator 113 and a transmitter 115. If an information vector 's' to be transmitted occurs in the signal transmission apparatus, the information vector 's' is delivered to the encoder 111. The encoder 111 generates a codeword vector 'c', that is, a block LDPC codeword, by encoding the information vector in an encoding scheme, and then outputs the generated codeword vector 'c' to the modulator 113. The encoding scheme corresponds to a LDPC encoding scheme according to the present invention.

The modulator 113 generates a modulation vector 'm' by modulating the codeword vector 'c' in a modulation scheme, and then outputs the generated modulation vector 'm' to the transmitter 115. The transmitter 115 inputs therein the modulation vector 'm' output from the modulator 113, executes transmission signal processing for the input modulation vector 'm', and then transmits the processed modulation vector to a signal reception apparatus through an antenna.

Figure 2:
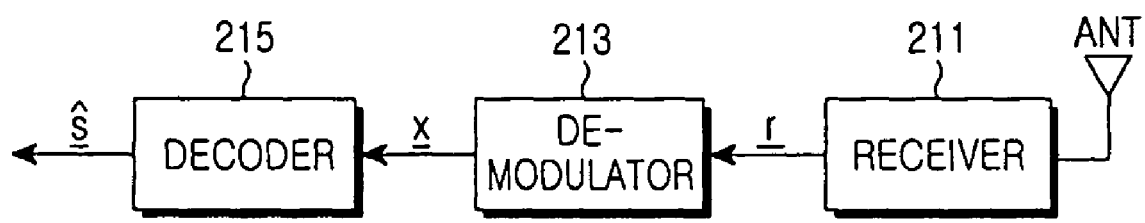
FIG. 2 is a block diagram illustrating the structure of a signal reception apparatus according to the present invention.

FIG. 2 is a block diagram illustrating the structure of a signal reception apparatus according to the present invention.

In FIG. 2, the signal reception apparatus according to the present invention includes a receiver 211, a demodulator 213 and a decoder 215. A signal transmitted by a signal transmission apparatus is received through an antenna of the signal reception apparatus, and the received signal is delivered to the receiver 211. The receiver 211 executes reception signal processing for the received signal to thereby generate a reception vector 'r', and then outputs the processed and generated reception vector 'r' to the demodulator 213. The demodulator 213 inputs therein the reception vector 'r' output from the receiver 211, generates a demodulation vector 'x' by demodulating the input reception vector 'r' in a demodulation scheme corresponding to a modulation scheme applied to a modulator of the signal transmission apparatus, that is, the modulator 113, and then outputs the generated demodulation vector 'x' to the decoder 215. The decoder 215 inputs therein the demodulation vector 'x' output from the demodulator 213, decodes the input demodulation vector 'x' in a decoding scheme corresponding to an encoding scheme applied to an encoder of the signal transmission apparatus, that is, the encoder 111, and then outputs the decoded demodulation vector into a finally restored information vector 'ŝ'. Herein, it is assumed that the decoding scheme, that is, LDPC decoding scheme, uses an iterative decoding algorithm based on sum-product algorithm.

FIG. 3 is a diagram illustrating a parity check matrix of a block LDPC code according to the present invention.

In FIG. 3, the parity check matrix includes a plurality of blocks, and one of a permutation matrix and a zero matrix is mapped to each of the plurality of blocks. Herein, each of the permutation matrix and the zero matrix has an $N_s \times N_s$ size. Each of $N_s$ columns constituting the permutation matrix has a weight of 1 and each of $N_s$ rows constituting the permutation matrix also has a weight of 1.

The parity check matrix includes an information part and a parity part. The information part represents a part of the parity check matrix, mapped to an actual information vector 's' during the process of encoding a block LDPC code. The parity part represent a part of the parity check matrix, mapped to an actual parity vector 'p' during the process of encoding the block LDPC code. Herein, the information vector 's' includes at least one of information bit, and the parity vector 'p' includes at least one of parity bit.

In FIG. 3, a superscript (or exponent) $a_{ij}$ of the permutation matrix P of an information part is either $0 \leq a_{ij} \leq N_s - 1$ or $a_{ij} = \infty$. The superscript $a_{ij}$ indicates that the permutation matrix P has a structure which is right-shifted by $a_{ij}$ in the identity matrix. Herein, 'i' represents the number of rows of matrixes included in the information part, and 'j' represents the number of columns of matrixes included in the information part. In FIG. 3, it is assumed that 'i' is m(i=m), and j is n(j=n).

A permutation matrix P with a superscript $a_{ij}=0$, i.e. a permutation matrix $P^0$, of the information part represents an identity matrix $I_{N_s \times N_s}$, and a permutation matrix P with a superscript $a_{ij}=\infty$, i.e. a permutation matrix $P^\infty$, represents a zero matrix. A permutation matrix P with a superscript $a_{ij}=-1$, i.e. a permutation matrix $P^{-1}$, represents a zero matrix. In FIG. 3, 'i' represents the number of rows of blocks mapped to the information part, and 'j' represents the number of columns of blocks mapped to information part. Also, superscripts $a_i$, x and y of the permutation matrixes P mapped to the parity part represent exponents of the permutation matrix P. However, for the convenience of explanation, the different superscripts $a_i$, x and y are used to distinguish the parity part from the information part. That is, in FIG. 3, $P^{a_1}$, and $P^{a_m}$ are also permutation matrixes, and the superscripts $a_1$ to $a_m$ are sequentially indexed to matrixes located in a diagonal part of the parity part. In addition, $P^x$ and $P^y$ are also permutation matrixes, and for the convenience of explanation, they are indexed in a different way to distinguish the parity part from the information part.

It is assumed that the parity check matrix includes a plurality of partial blocks in order to facilitate a method of designing a parity check matrix of the block LDPC code and a method of encoding the block LDPC code. The partial block includes at least one block. In this case, the parity check matrix can be expressed as illustrated in FIG. 4.

Figure 4:
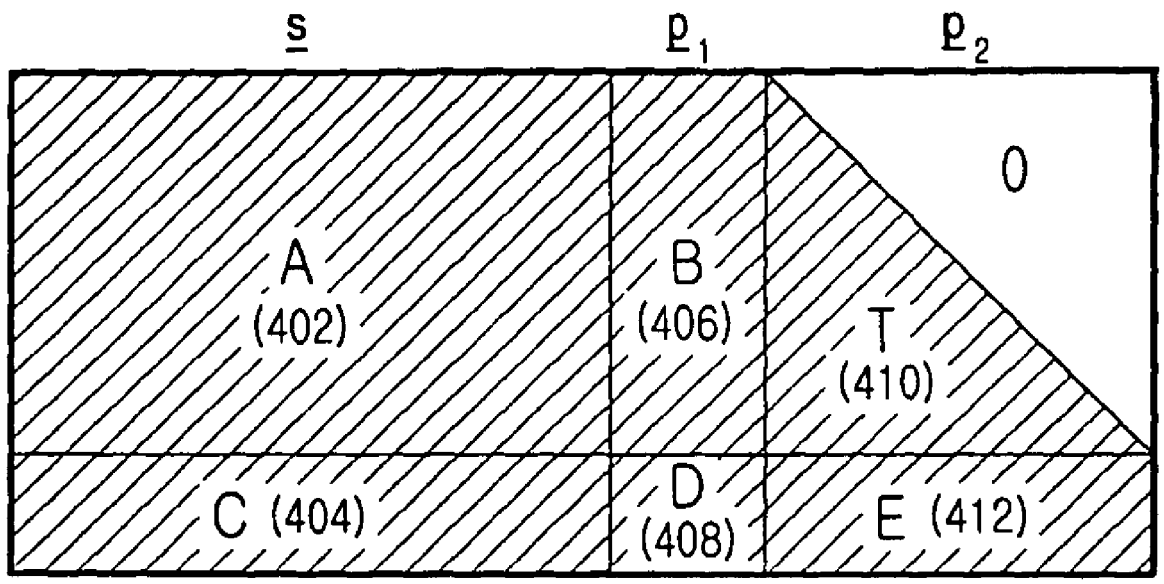
FIG. 4 is a diagram illustrating the parity check matrix of FIG. 3 which is divided into 6 partial blocks.

FIG. 4 is a diagram illustrating the parity check matrix of FIG. 3 which is divided into 6 partial blocks.

In FIG. 4, a parity check matrix of the block LDPC code illustrated in FIG. 3 is divided into an information part, a first parity part, and a second parity part. Herein, each of the information part, the first parity part, and the second parity part includes at least one partial block. The information part represents a part of the parity check matrix, mapped to an actual information vector 's' during the process of coding a block LDPC code, like the information part described in conjunction with FIG. 3. The first parity part and the second parity part represent a part of the parity check matrix, mapped to an actual parity vector 'p' during the process of coding the block LDPC code, like the parity part described in conjunction with FIG. 3, and the parity part is divided into two parts, that is, a first parity part and a second parity part. When the parity vector 'p' includes a first parity vector '$p_1$' and a second parity vector '$p_2$', the first parity part corresponds the first parity vector '$\overline{p_1}$' and the second parity part corresponds the second parity vector '$\overline{p_2}$'

Matrixes A and C correspond to partial blocks A 402 and C 404 of the information part, matrixes B and D correspond to partial blocks B 406 and D 408 of the first parity part, and matrixes T and E correspond to partial blocks T 410 and E 412 of the second parity part. Although the parity check matrix is divided into 7 partial blocks in FIG. 4, it should be noted that '0' is not a separate partial block and because the matrix T corresponding to the partial block T 410 has a full lower triangular form, a region where zero matrixes are arranged on the basis of a diagonal is represented by '0'.

The matrix B mapping to the partial block B 406, the matrix E mapping to the partial block E 412, and the matrix T mapping to the partial block T 410 are generated as illustrated in FIG. 5 for minimizing an encoding complexity of a block LDPC code.

FIG. 5 is a diagram illustrating a transpose matrix of the matrix B illustrated in FIG. 4, the matrix E illustrated in FIG. 4, the matrix T illustrated in FIG. 4 and an inverse matrix of the matrix T illustrated in FIG. 4.

In FIG. 5, a matrix $B^T$ represents a transpose matrix of the matrix B, and a matrix $T^{-1}$ represents an inverse matrix of the matrix T. The matrix T has a form similar to the form of the full lower triangular matrix. That is, an identity matrix is arranged in blocks located in diagonal of the partial matrix T, and a permutation matrix is arranged in blocks located in dual diagonal with the diagonal of the partial matrix T. Here, a matrix arranged in a block is referred as 'block matrix'.

As described above, a communication system using a block LDPC code must support a parity check matrix supporting a plurality of code rates for supporting a plurality of code rates. So, the present invention provides a method for generating a parity check matrix supporting a plurality of code rates. That is, the present invention provides a method for supporting a plurality of code rates using a child parity check matrix generated using a first parity check matrix, that is, a parent parity check matrix. For supporting a code rate greater than a code rate of the parent parity check matrix, the parent parity check matrix is punctured using a predetermined puncturing scheme, and for supporting a code rate less than the code rate of the parent parity check matrix, the child parity check matrix is used. Here, it is assumed that the child parity check matrix is generated using the parent parity check matrix for the convenience of explanation, but it is possible that each of the parent parity check matrix and child parity check matrix is generated individually.

A structure of a parent parity check matrix will be described.

In the present invention, it is assumed that a parent parity check matrix is a parity check matrix of a semi-systematic block LDPC code. Here, the semi-systematic block LDPC code represents a code concatenated from a general block LDPC code and a single parity check code.

Generally, in a linear block code, a systematic code refers to a code in which a part of a codeword vector during its transmission is comprised of an information vector to be transmitted. Therefore, a signal reception apparatus can decode only the part corresponding to the information vector in the codeword vector when decoding the codeword vector transmitted from a signal transmission apparatus.

However, a non-systematic code refers to a code for which an encoder transmits a codeword vector mapped to an information vector, instead of transmitting the information vector during the transmission of the codeword vector. Unlike the systematic code in which a part of the codeword vector includes the information vector, the non-systematic code has no information vector included in the codeword vector. A part of the systematic code is composed of an information vector, but a codeword vector of the non-systematic code dose not include an information vector. The semi-systematic block LDPC code proposed in the present invention refers to a code in which only a part of the information vector is included in the codeword vector and the remaining parity vector is included in the codeword vector, unlike the systematic code in which the entire information vector is included in the codeword vector.

A parity check matrix of a semi-systematic block LDPC code proposed in the present invention is divided into two types, that is, a first type and a second type. A first type semi-systematic block LDPC code will be described in FIG. 6, and a second type semi-systematic block LDPC code will be described in FIG. 7.

Figure 6:
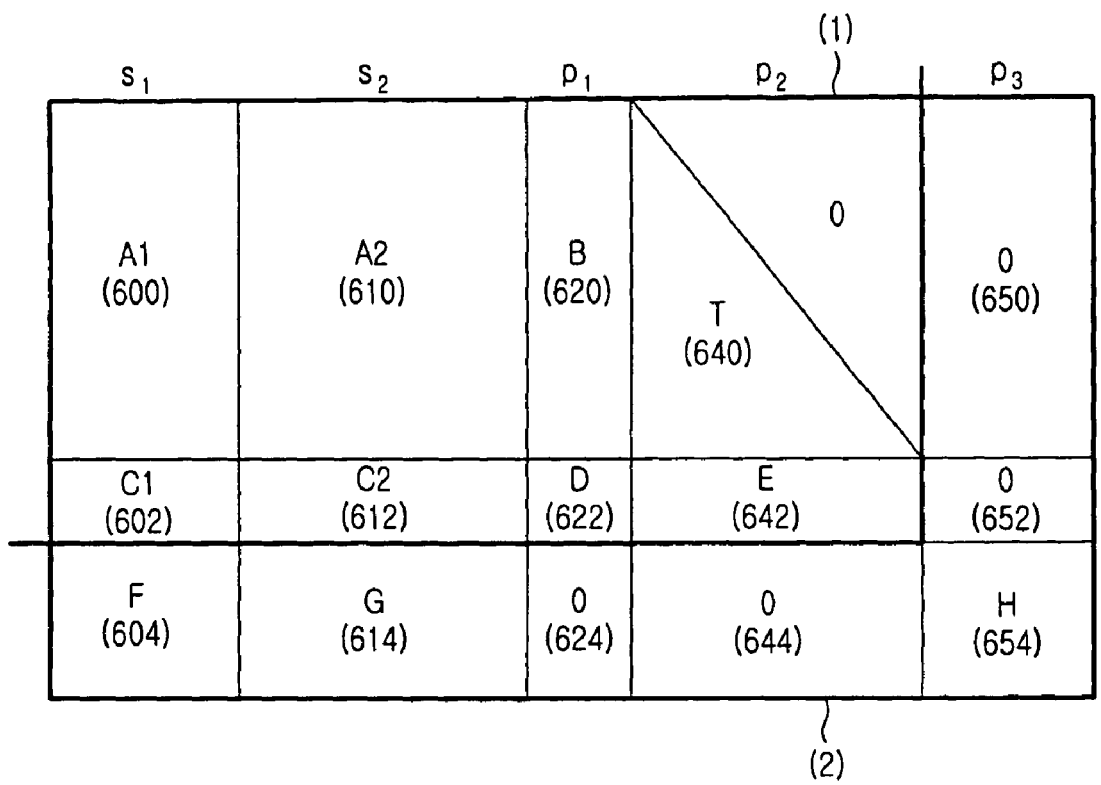
FIG. 6 is a diagram illustrating a parity check matrix of a first type semi-systematic block LDPC code according to the present invention.

FIG. 6 is a diagram illustrating a parity check matrix of a first type semi-systematic block LDPC code according to the present invention.

First, when a parity check matrix of a semi-systematic block LDPC code is generated using a parity check matrix of a block LDPC code, a performance of the semi-systematic block LDPC code improves. So, a parity check matrix of a semi-systematic block LDPC code according to the present invention is generated using a parity check matrix of a block LDPC code.

In FIG. 6, the parity check matrix of the first type semi-systematic block LDPC code includes a partial block A1 600, a partial block C1 602, a partial block F 604, a partial block A2 610, a partial block C2 612, a partial block G 614, a partial block B 620, a partial block D 622, a partial block 0 624, a partial block T 640, a partial block E 642, a partial block 0 644, a partial block 0 650, a partial block 0 652, and a partial block H 654.

A structure of an encoder for encoding an information vector using the parity check matrix of the first type semi-systematic block LDPC code in FIG. 6 is divided into two parts, that is, a part (1) corresponding to a parity check matrix of a general block LDPC code and a part (2) corresponding to newly-added partial blocks. For convenience, the part (1) corresponding to the parity check matrix of the general block LDPC code will be referred to as an "existing part" and the part (2) corresponding to the newly-added partial blocks will be referred to as a "new part."

First, the existing part will be described.

The existing part includes the partial block A1 600, the partial block C1 602, the partial block A2 610, the partial block C2 612, the partial block B 620, the partial block D 622, the partial block T 640, the partial block E 642. Partial blocks included in the existing part have a relation with partial blocks described in FIG. 4.

The partial block A 402 includes the partial block A1 600 and the partial block A2 610, the partial block C 404 includes the partial block C1 602 and the partial block C2 612, the partial block B 406 is identical to the partial block B 620, the partial block D 408 is identical to the partial block D 622, the partial block T 410 is identical to the partial block T 640, and the partial block E 412 is identical to the partial block E 642.

Next, the new part will be described.

The new part includes the partial block F 604, the partial block G 614, the partial block 0 624, the partial block 0 644, the partial block 0 650, the partial block 0 652, the partial block H 654. The partial block F 604 corresponds information bits mapping to the partial block A1 600 and the partial block C1 602 among information bits of an information vector. When the degree of the column of the partial block A1 600 is '1', a degree of the column of the partial block C1 602 is 'm', and a degree of the column of the partial block F 604 is 'n', a degree of a partial block including the partial block A1 600, the partial block C1 602 and the partial block F 604 is '1+m+n'. '1+m+n' is greater than 'k', 'k' is a degree of a partial block including the partial block A2 610, the partial block C2 612 and the partial block G 614.

When a signal transmission apparatus detects a need of puncturing a part of an information vector, the signal transmission apparatus punctures information bits mapping to the partial block including the partial block A1 600, the partial block C1 602 and the partial block F 604. In this case, the signal transmission apparatus punctures information bits having a high degree to improve a restored performance of a signal reception apparatus. The information bits having a high degree is not transmitted because it generally has a high reliability. However, if the information bits having a high degree is not transmitted, an error probability increases at the information bits having a high degree, such that additional parity bits are transmitted to maintain the reliability. For example, a first information bit among the information bits mapping to the partial block including the partial block A1 600, the partial block C1 602 and the partial block F 604 can be punctured.

A partial block H 654 included in the new part corresponds to a newly added parity bit. For example, an identity matrix is arranged in the partial block H 654. A degree of each of all of the columns in the identity matrix is '1'. When the new part includes the partial block 0 624 and the partial block 0 644, such that a concatenation of an encoder for a general block LDPC code and an encoder for a single parity check code is possible. A parity part of the general block LDPC code can perform parity generation only on a block by block basis because it has an accumulator structure. However, the single parity check code part can perform coding on the part (2) all at once because it has a structure in which only the diagonal elements have a value of 1. Therefore, the first type semi-systematic block LDPC code proposed in the present invention is almost similar to the general block LDPC code in terms of an encoding time.

In FIG. 6, the partial block A1 600, the partial block C1 602, and the partial block F 604 correspond to a first information part, the partial block A2 610, the partial block C2 612, and the partial block G 614 correspond to a second information part, the partial block B 620, the partial block D 622, and the partial block 0 624 correspond to a first parity part, the partial block T 640, the partial block E 642, and the partial block 0 644 correspond to a second parity part, and the partial block 0 650, the partial block 0 652, and the partial block H 654 correspond to a third parity part. Here, the third parity part corresponds to a third parity vector '$p_3$'. When an information vector '$\underline{s}$' includes a first information vector '$\underline{s_1}$' and a second information vector '$\underline{s_2}$' the first information part corresponds to the first information vector '$\underline{s_1}$' and the second information part corresponds to the second information vector '$\underline{s_2}$'.

An operation for generating a codeword vector '$\underline{c}$', that is, a semi-systematic block LDPC codeword by encoding an information vector '$\underline{s}$' using the parity check matrix of the first type semi-systematic block LDPC code, will be described.

First, because the information part includes the first information part and the second information part, and a degree of the first information part is greater than a degree of the second information part, information bits mapping to the first information part are punctured when a signal transmission apparatus detects a need for puncturing a part of the information vector '$\underline{s}$'. In this case, the codeword vector '$\underline{c}$' can be expressed as Equation (1).

$$\underline{c} = [\underline{s_2} \underline{p_1} \underline{p_2} \underline{p_3}] \qquad (1)$$

In FIG. 6, it is assumed that a zero matrix is arranged in each of the partial block 0 624, the partial block 0 644, and the partial block 0 650 among the partial blocks corresponding to the third parity part, but it is possible that a matrix different from the zero matrix is arranged in each of the partial block 0 624, the partial block 0 644, and the partial block 0 650.

The parity check matrix of the first type semi-systematic block LDPC code has superior performance when a code with a code rate less than 1/2 is generated. A new parity check matrix different from the parity check matrix of the first type semi-systematic block LDPC code, that is, a parity check matrix of the second type semi-systematic block LDPC code, must be used to generate a semi-systematic block LDPC code with a high code rate.

Figure 7:
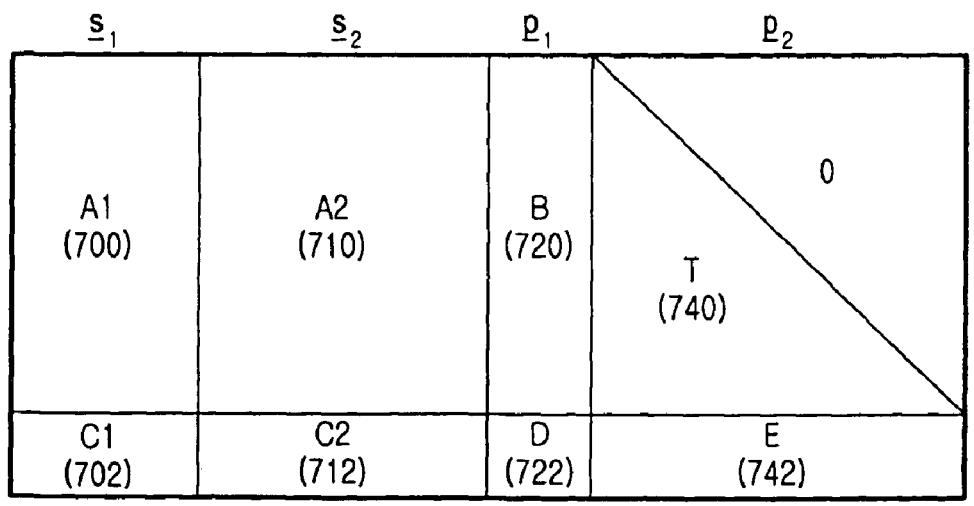
FIG. 7 is a diagram illustrating a parity check matrix of a second type semi-systematic block LDPC code according to the present invention.

FIG. 7 is a diagram illustrating a parity check matrix of a second type semi-systematic block LDPC code according to the present invention.

In FIG. 7, the parity check matrix of the second type semi-systematic block LDPC code includes a partial block A1 700, a partial block C1 702, a partial block A2 710, a partial block C2 712, a partial block B 720, a partial block D 722, a partial block T 740, and a partial block E 742.

The partial blocks in FIG. 7 have a relation with partial blocks described in FIG. 4.

The partial block A 402 includes the partial block A1 700 and the partial block A2 710, the partial block C 404 includes the partial block C1 702 and the partial block C2 712, the partial block B 406 is identical to the partial block B 720, the partial block D 408 is identical to the partial block D 722, the partial block T 410 is identical to the partial block T 740, and the partial block E 412 is identical to the partial block E 742.

When a degree of the column of the partial block A1 700 is '1', and a degree of the column of the partial block C1 702 is 'm', a degree of a partial block including the partial block A1 700 and the partial block C1 702 is '1+m'. A partial block including the partial block A1 700 and partial block C1 702 includes a part of the columns included in a partial block including the partial block A 402 and the partial block C 404. Here, the columns included the partial block including in the partial block A1 700 and partial block C1 702 are columns with a high degree among the columns included in the partial block including the partial block A 402 and the partial block C 404.

An operation for generating a codeword vector 'c', that is, a semi-systematic block LDPC codeword by encoding an information vector 's' using the parity check matrix of the second type semi-systematic block LDPC code, will be described.

First, because the information part includes the first information part and the second information part, and a degree of the first information part is greater than a degree of the second information part, information bits mapping to the first information part are punctured when a signal transmission apparatus detects a need for puncturing a part of the information vector 's'. In this case, the codeword vector 'c' can be expressed as Equation (2).

$$\underline{c} = [\underline{s}_2 \underline{p}_1 \underline{p}_2] \qquad (2)$$

As described in FIG. 6 and FIG. 7, a parent parity check matrix is one of a parity check matrix of a first type semi-systematic block LDPC code and a parity check matrix of a second type semi-systematic block LDPC code. A child parity check matrix is generated using the parent parity check matrix.

When a parent parity check matrix is a parity check matrix of a first type semi-systematic block LDPC code, a child parity check matrix generated using the parent parity check matrix of the first type semi-systematic block LDPC code will be described.

Figure 8:
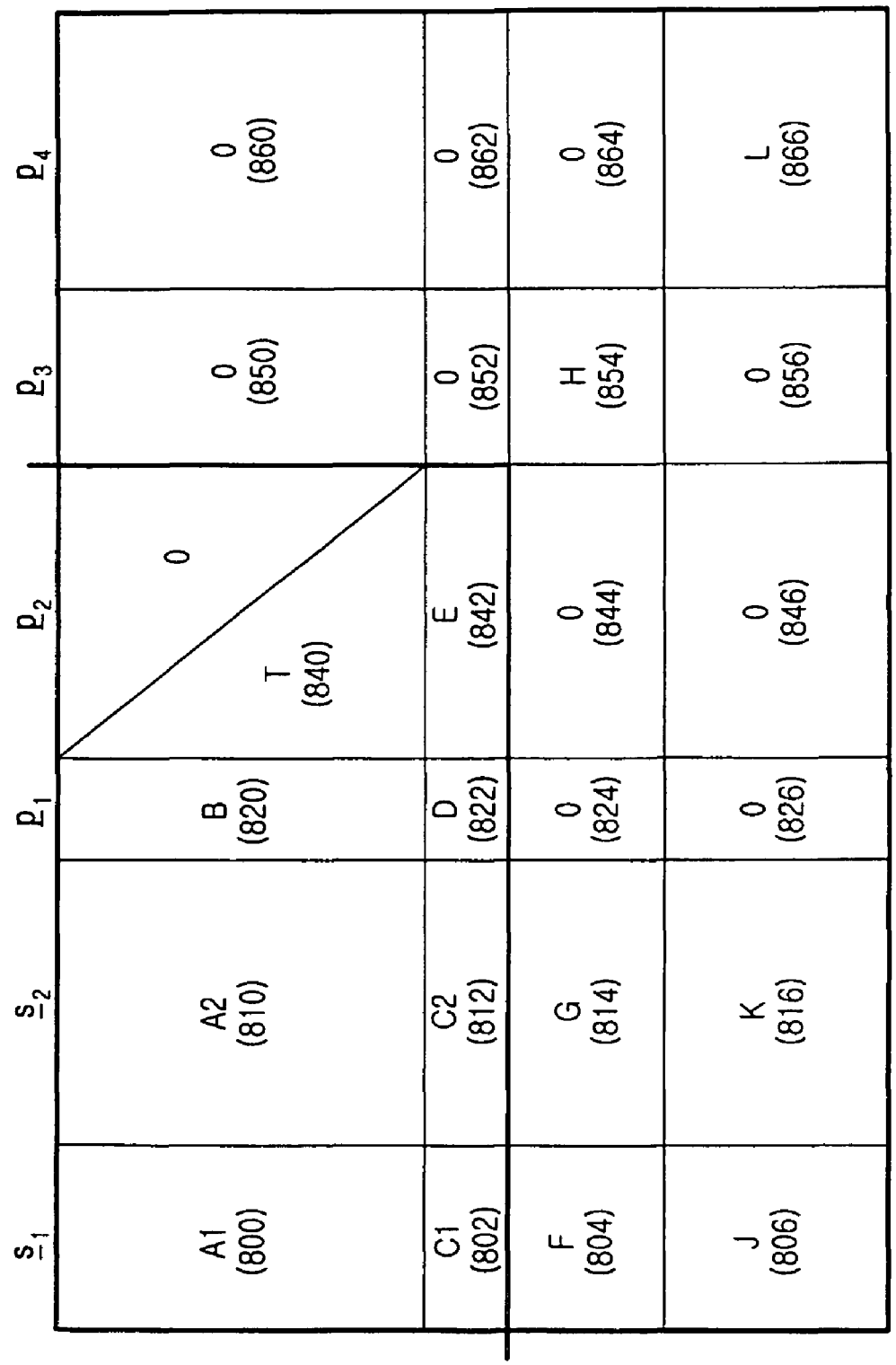
FIG. 8 is a diagram illustrating a child parity check matrix using a parent parity check matrix of a first type semi-systematic block LDPC code according to the present invention.

FIG. 8 is a diagram illustrating a child parity check matrix using a parent parity check matrix of a first type semi-systematic block LDPC code according to the present invention.

For the convenience of explanation, the child parity check matrix using the parent parity check matrix of the first type semi-systematic block LDPC code is called as 'a first type child parity check matrix', and the parent parity check matrix of the first type semi-systematic block LDPC code is called as 'a first type parent parity check matrix'.

In FIG. 8, the first type child parity check matrix includes a partial block A1 800, a partial block C1 802, a partial block F 804, a partial block J 806, a partial block A2 810, a partial block C2 812, a partial block G 814, a partial block K 816, a partial block B 820, a partial block D 822, a partial block 0 824, a partial block 0 826, a partial block T 840, a partial block E 842, a partial block 0 844, a partial block 0 846, a partial block 0 850, a partial block 0 852, a partial block H 854, a partial block 0 856, a partial block 0 860, a partial block 0 862, a partial block 0 864, and a partial block L 866.

The partial block A1 800 is identical to the partial block A1 600, the partial block C1 802 is identical to the partial block C1 602, the partial block F 804 is identical to the partial block F 604, the partial block A2 810 is identical to the partial block A2 610, the partial block C2 812 is identical to the partial block C2 612, the partial block G 814 is identical to the partial block G 614, the partial block B 820 is identical to the partial block B 620, the partial block D 822 is identical to the partial block D 622, the partial block 0 824 is identical to the partial block 0 624, the partial block T 840 is identical to the partial block T 640, the partial block E 842 is identical to the partial block E 642, the partial block 0 844 is identical to the partial block 0 644, the partial block 0 850 is identical to the partial block 0 650, the partial block 0 852 is identical to the partial block 0 652, and the partial block H 854 is identical to the partial block H 654.

Also, the partial block J 806, the partial block K 816, the partial block 0 826, the partial block 0 846, the partial block 0 856, the partial block 0 860, the partial block 0 862, the partial block 0 864, and a partial block L 866 are partial blocks newly-added to the first type parent parity check matrix for generating a codeword vector 'c' with a code rate less than a code rate of a codeword vector 'c' generated using the first type parent parity check matrix. For example, an identity matrix is arranged in the partial block L 866. For supporting a code rate less than a code rate of the parent parity check matrix, a final codeword vector is generated by adding a single parity check code to a parent codeword vector generated using the parent parity check matrix. Therefore, the time required for generating a codeword vector c by encoding an information vector s using the first-type child parity check matrix is almost equal to the time required for generating a codeword vector c by encoding an information vector s using the first-type parent parity check matrix.

In FIG. 8, it is assumed that a zero matrix is arranged in each of the partial block 0 824, the partial block 0 844, the partial block 0 850, and the partial block 0 852 among the partial blocks corresponding to the third parity part, but it is possible that a matrix different from the zero matrix is arranged in each of the partial block 0 824, the partial block 0 844, the partial block 0 850, and the partial block 0 852. And, in FIG. 8, it is assumed that a zero matrix is arranged in each of the partial block 0 826, the partial block 0 846, the partial block 0 856, the partial block 0 860, the partial block 0 862, and the partial block 0 864 among the partial blocks corresponding to a fourth parity part, but it is possible that a matrix different from the zero matrix is arranged in each of the partial block 0 826, the partial block 0 846, the partial block 0 856, the partial block 0 860, the partial block 0 862, and the partial block 0 864.

In the process of decoding a codeword of a block LDPC code generated using the puncturing scheme, the original parity check matrix is used by regarding the punctured parity bits as erased bits. That is, if a Log-Likelihood Ratio (LLR) value input from a channel over which the punctured parity bits are transmitted is always regarded as '0', the original parity check matrix can be used as is, during decoding. Therefore, a punctured codeword node transmits only '0' in a decoding process when codeword bits corresponding to column with degree 1, of a parity check matrix. Since an output signal from a check node connected to the punctured codeword is always '0', it is possible to delete rows connected to the punctured codeword.

When punching the newly added codeword bits in order to generate a codeword vector having a lower code rate, an identical effect to when performing encoding/decoding by using parent parity check matrix is obtained. That is, when generating a LDPC code having high code rate by using the child parity check matrix, the encoding/decoding can be performed by using a parent parity check matrix excepting the additionally generated part from a child parity check matrix, and when generating a LDPC code having low code rate, the whole child parity check matrix can be used.

Degree distribution of the first-type child parity check matrix can be designed based on the degree distribution of the first-type parent parity check matrix, using the density evolution scheme. In this case, the degree distribution of the first-type parent parity check matrix is designed using the density evolution scheme such that the codeword vector c generated by the first-type parent parity check matrix is guaranteed the superior performance, and the degree distribution of the first-type child parity check matrix is designed using the density evolution scheme in the state where the intact degree distribution of the first-type parent parity check matrix is used.

An operation for generating a codeword vector 'c', that is, a semi-systematic block LDPC codeword by encoding an information vector 's' using the first type child parity check matrix will be described.

First, because the information part includes the first information part and the second information part, and a degree of the first information part is greater than a degree of the second information part, information bits mapping to the first information part are punctured when a signal transmission apparatus detects a need of puncturing a part of the information vector 's'. In this case, the codeword vector 'c' can be expressed as Equation (3).

$$\underline{c} = [\underline{s_2 p_1 p_2 p_3 p_4}] \quad (3)$$

When a parent parity check matrix is a parity check matrix of a second type semi-systematic block LDPC code, a child parity check matrix generated using the parent parity check matrix of the second type semi-systematic block LDPC code will be described.

Figure 9:
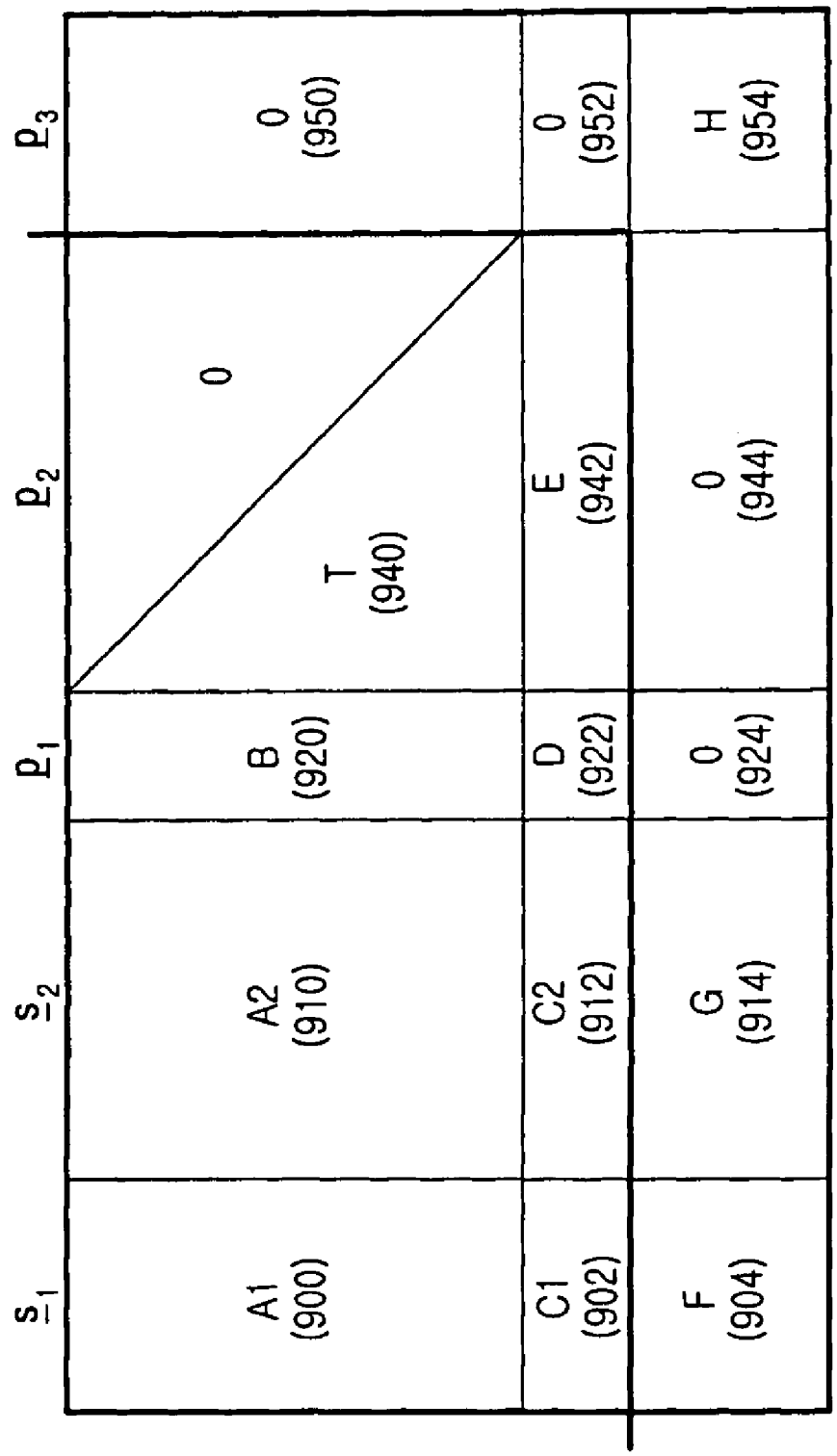
FIG. 9 is a diagram illustrating a child parity check matrix using a parent parity check matrix of a second type semi-systematic block LDPC code according to the present invention.

FIG. 9 is a diagram illustrating a child parity check matrix using a parent parity check matrix of a second type semi-systematic block LDPC code according to the present invention.

For the convenience of explanation, the child parity check matrix using the parent parity check matrix of the second type semi-systematic block LDPC code is called as 'a second type child parity check matrix', and the parent parity check matrix of the second type semi-systematic block LDPC code is called as 'a second type parent parity check matrix'.

In FIG. 9, the second type child parity check matrix includes a partial block A1 900, a partial block C1 902, a partial block F 904, a partial block A2 910, a partial block C2 912, a partial block G 914, a partial block B 920, a partial block D 922, a partial block 0 924, a partial block T 940, a partial block E 942, a partial block 0 944, a partial block 0 950, a partial block 0 952, and a partial block H 954.

The partial block A1 900 is identical to the partial block A1 700, the partial block C1 902 is identical to the partial block C1 702, the partial block A2 910 is identical to the partial block A2 710, the partial block C2 912 is identical to the partial block C2 712, the partial block B 920 is identical to the partial block B 720, the partial block D 922 is identical to the partial block D 722, the partial block T 940 is identical to the partial block T 740, and the partial block E 942 is identical to the partial block E 742.

The partial block F 904, the partial block G 914, the partial block 0 924, the partial block 0 944, the partial block 0 950, the partial block 0 952, and the partial block H 954 are partial blocks newly-added to the second type parent parity check matrix for generating a codeword vector 'c' with a code rate less than a code rate of a codeword vector '$\overline{c}$' generated using the second type parent parity check matrix. For example, an identity matrix is arranged in the partial block H 954. Therefore, the time required for generating a codeword vector c by encoding an information vector s using the second-type child parity check matrix is almost equal to the time required for generating a codeword vector c by encoding an information vector s using the second-type parent parity check matrix.

In FIG. 9, it is assumed that a zero matrix is arranged in each of the partial block 0 924, the partial block 0 944, the partial block 0 950, and the partial block 0 952 among the partial blocks corresponding to the third parity part, but it is possible that a matrix different from the zero matrix is arranged in each of the partial block 0 924, the partial block 0 944, the partial block 0 950, and the partial block 0 952.

Figure 10:
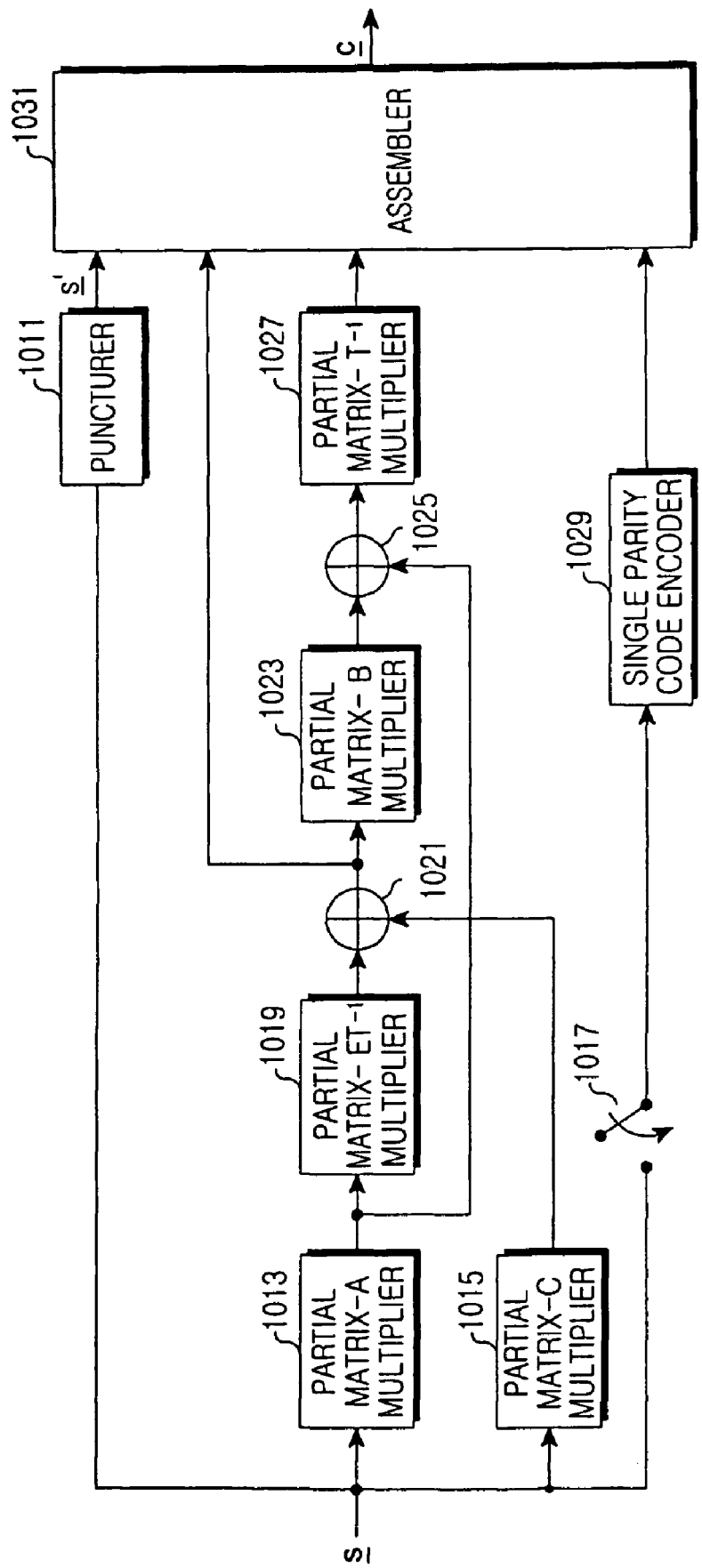
FIG. 10 is a diagram illustrating one internal structure of an encoder as illustrated in FIG. 1.

FIG. 10 is a diagram illustrating an example of internal structure of an encoder 111 as illustrated in FIG. 1.

In FIG. 10, the encoder 111 includes a puncturer 1011, a partial matrix-A multiplier 1013, a partial matrix-C multiplier 1015, a switch 1017, a matrix-$ET^{-1}$ multiplier 1019, an XOR operator 1021, a partial matrix-B multiplier 1023, an XOR operator 1025, a matrix-$T^{-1}$ multiplier 1027, a single parity code encoder 1029, an assembler 1031, and a controller (not shown).

First, an operation of the controller will be described.

The controller selects one of a parent parity check matrix and a child parity check matrix corresponding to a code rate to be used in a signal transmission apparatus. The controller determines a matrix A, a matrix B, a matrix T, a matrix C, a matrix D, and a matrix E corresponding to the selected parity check matrix. The parent parity check matrix is one of a first type parent parity check matrix and a second type parent parity check matrix, and the child parity check matrix is one of a first type child parity check matrix and a second type child parity check matrix. The controller determines whether there are information bits to be punctured among information bits of an information vector 's' corresponding to the selected parity check matrix. The controller determines if it is necessary to generate a single parity code corresponding to the selected parity check matrix.

If an information vector 's' to be encoded is received, the information vector 's' is delivered to the puncturer 1011, the partial matrix-A multiplier 1013, the partial matrix-C multiplier 1015 and the switch 1017. The puncturer 1011 outputs the information vector 's' to the assembler 1031 by bypassing the information vector 's' under the control of the controller, or outputs a punctured information vector 's''' to the assembler 1031 under the control of the controller. Here, the punctured information vector 's''' is generated by puncturing corresponding information bits among the information bits of the information vector 's'. The controller determines that the puncturer 1011 outputs the information vector 's' to the assembler 1031 corresponding to the selected parity check matrix, or that the puncturer 1011 outputs the punctured information vector 's''' to the assembler 1031 corresponding to the selected parity check matrix.

Also, the controller controls an operation of the switch 1017 corresponding to the selected parity check matrix. The controller controls the switch 1017 to open when the selected parity check matrix is a parent parity check matrix, and controls the switch 1017 to close when the selected parity check matrix is a child parity check matrix.

The partial matrix-A multiplier 1013 multiplies the information vector 's' by the matrix A, and outputs the result to the matrix-$ET^{-1}$ multiplier 1019 and the XOR operator 1025. The matrix-$ET^{-1}$ multiplier 1019 multiplies the signal output from the partial matrix-A multiplier 1013 by the matrix $ET^{-1}$, and outputs the result to the XOR operator 1021. The partial matrix-C multiplier 1015 multiplies the information vector 's' by the matrix C, and outputs the result to the XOR operator 1021. The XOR operator 1021 performs an XOR operation on the signal output from the matrix-$ET^{-1}$ multiplier 1019 and the signal output from the partial matrix-C multiplier 1015, and outputs the result to the partial matrix-B multiplier 1023 and the assembler 1031. The signal output from the XOR operator 1021 is a first parity vector '$\underline{p_1}$'.

The partial matrix-B multiplier 1023 multiplies the signal output from the XOR operator 1021 by the matrix B, and outputs the result to the XOR operator 1025. The XOR operator 1025 performs an XOR operation on the signal output from the partial matrix-A multiplier 1013 and the signal output from the partial matrix-B multiplier 1023, and outputs the result to the matrix-$T^{-1}$ multiplier 1027. The matrix-$T^{-1}$ multiplier 1027 multiplies the signal output from the XOR operator 1025 by the matrix $T^{-1}$, and outputs the result to the assembler 1031. The signal output from the matrix-$T^{-1}$ multiplier 1027 is a second parity vector '$p_2$'.

The switch 1017 performs a switching operation under the control of the controller, and the controller controls the switch 1017 to close to input the information vector 's' to the single parity code encoder 1029 when there is a need to generate a third parity vector '$p_3$' or to generate the third parity vector '$p_3$' and a fourth parity vector '$p_4$'. The single parity code encoder 1029 generates a single parity codeword, that is, the third parity vector '$p_3$' or the third parity vector '$p_3$' and the fourth parity vector '$p_4$' by encoding the signal output from the switch 1017, and outputs the result to the assembler 1031.

The assembler 1031 assembles the signal output from the puncturer 1011, the signal output from the XOR operator 1021, the signal output from the matrix-$T^{-1}$ multiplier 1027, and the signal output from the single parity code encoder 1029 under the control of the controller, and outputs the result as a codeword vector 'c'

In FIG. 10, although the information vector 's', or the punctured information vector 's'', the first parity vector '$p_1$', the second parity vector '$p_2$', the fourth parity vector '$p_4$' are generated in parallel according to the code rate, and then are assembled as a codeword vector 'c' using the generated vectors by way of example under the control of the controller, only the corresponding vectors among the information vector 's', or the punctured information vector 's'', the first parity vector '$p_1$', the second parity vector '$p_2$', the fourth parity vector '$p_4$' can generated be sequentially according to the code rate, and then are assembled as the codeword vector 'c' using the generated vectors under the control of the controller.

In FIG. 10, the encoder 111 includes the puncturer 1011 by way of example. However, the puncturer 1011 does not perform a puncturing operation when a code rate to be used in the signal transmission apparatus is one of the parent code rate and the child code rate. Thus, in the signal transmission apparatus uses one of the parent code rate and the child code rate, the encoder 111 does not need to include the puncturer 1011.

Figure 11:
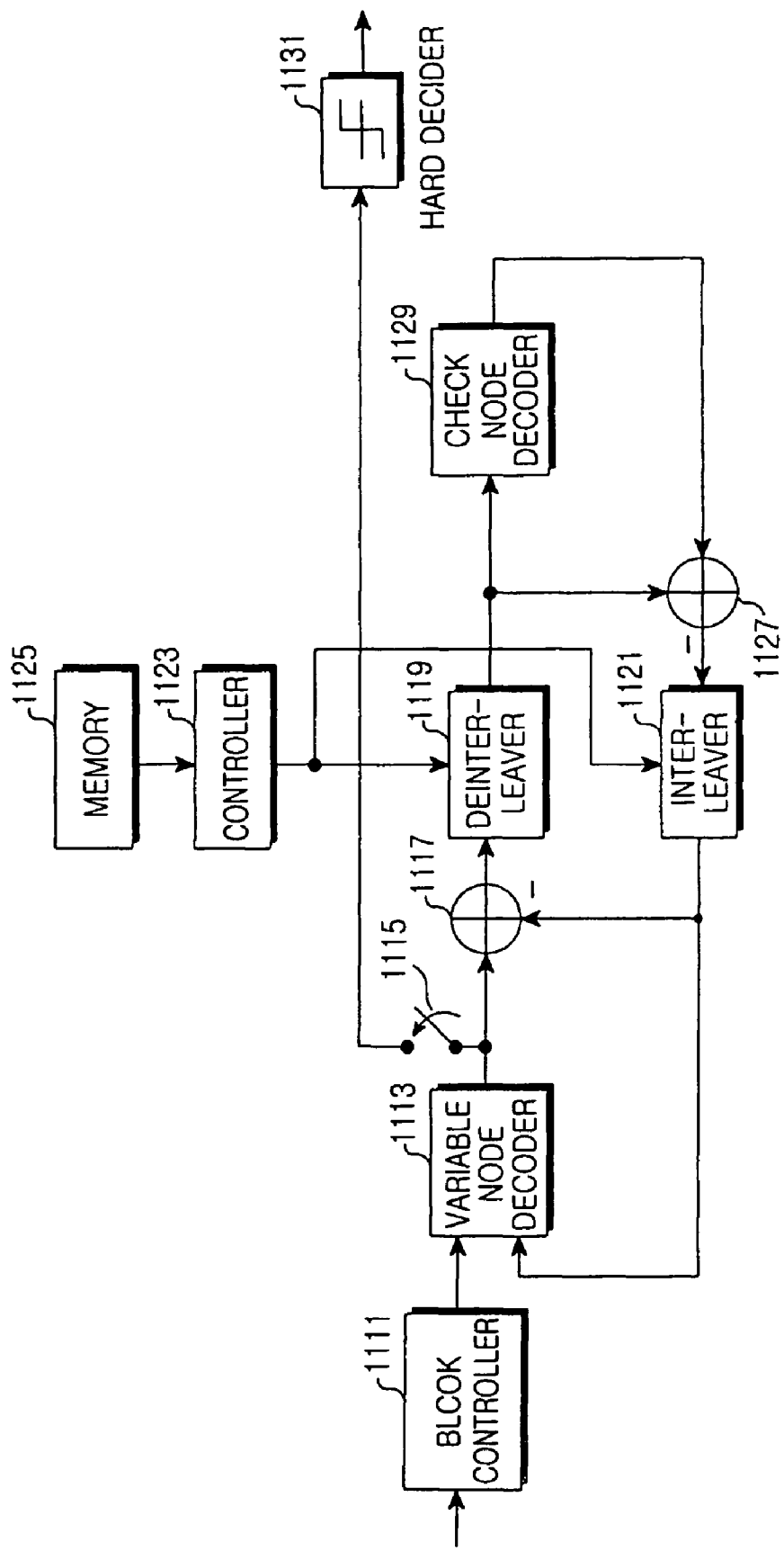
FIG. 11 is a diagram illustrating an internal structure of a decoder as illustrated in FIG. 2.

FIG. 11 is a diagram illustrating an internal structure of a decoder 215 as illustrated in FIG. 2.

In FIG. 11, the decoder 215 includes a block controller 1111, a variable node decoder 1113, a switch 1115, an XOR operator 1117, a deinterleaver 1119, an interleaver 1121, a controller 1123, a memory 1125, an XOR operator 1127, a check node decoder 1129, and a hard decider 1131.

The signal output from the demodulator 213 of FIG. 2 is delivered to the block controller 1111 that determines a size of a codeword vector 'c' according to a size of a codeword vector 'c' used in the signal transmission apparatus, using the signal output from the demodulator 213. When the signal transmission apparatus transmits a punctured information vector 's'', the block controller 1111 inserts '0' in the bits corresponding to punctured information bits and outputs the result to the variable node decoder 1113. Here, the punctured information vector 's'' is generated by puncturing corresponding information bits among information bits of an information vector 's'. In addition the block controller 1111 previously stores a parent parity check matrix and a child parity check matrix predefined between the signal transmission apparatus and the signal reception apparatus, and also previously stores puncturing information of the information bits corresponding to a code rate used in the signal transmission apparatus. The block controller 1111 previously stores not only the number of information bits punctured according to the code rate, but also the position information thereof.

The variable node decoder 1113 calculates probable values of the signal output from the block controller 1111, updates the calculated probable values and outputs the result to the switch 1115 and the XOR operator 1117. The variable node decoder 1113 connects variable nodes according to the parity check matrix previously set in the decoder 215, and an update operation having as many input values and output values as the number of '1's connected to the variable nodes is performed. The number of '1's connected to the variable nodes is equal to a weight for each of columns that make up the parity check matrix. Therefore, an internal operation of the variable node decoder 1113 differs according to the weight for each of the columns that make up the parity check matrix.

The XOR operator 1117 subtracts the output signal of the interleaver 1121 in the previous iterative decoding process from the output signal of the variable node decoder 1113, and outputs the result to the deinterleaver 1119. If the current decoding process is an initial decoding process, the output signal of the interleaver 1121 should be regarded as '0'.

The deinterleaver 1119 deinterleaves the signal output from the XOR operator 1117 according to a preset deinterleaving scheme, and outputs the result to the XOR operator 1127 and the check node decoder 1129. Herein, the deinterleaver 1119 has an internal structure corresponding to the parity check matrix, because an output value for the input value of the interleaver 1121 corresponding to the deinterleaver 1119 differs according to positions of the elements having a value of '1' in the parity check matrix.

The XOR operator 1127 subtracts the output signal of the deinterleaver 1119 from the output signal of the check node decoder 1129 in the previous iterative decoding process, and outputs the result to the interleaver 1121. The check node decoder 1129 connects check nodes according to the parity check matrix previously set in the decoder 215, and an update operation having as many input values and output values as the number of '1's connected to the check nodes is performed. The number of '1's connected to the check nodes is equal to a weight for each of rows that make up the parity check matrix. Therefore, an internal operation of the check node decoder 1129 differs according to the weight for each of the rows that make up the parity check matrix.

The interleaver 1121, under the control of the controller 1123, interleaves the signal output from the XOR operator 1127 using a preset interleaving scheme, and outputs the result to the XOR operator 1117 and the variable node decoder 1113. The controller 1123 reads interleaving scheme information stored in the memory 1125, and controls the interleaving scheme of the interleaver 1121. If the current decoding process is an initial decoding process, the output signal of the deinterleaver 1119 should be regarded as '0'.

By iteratively performing the above processes, highly-reliable decoding is performed without error, and after an iterative decoding process corresponding to a preset iteration is performed, the switch 1115 opens between the variable node decoder 1113 and the XOR operator 1117, and closes between the variable node decoder 1113 and the hard decider 1131 so that the output signal of the variable node decoder 1113 is delivered to the hard decider 1131. The hard decider 1131 performs hard decision on the signal output from the variable node decoder 1113, and outputs the hard decision value. The output value of the hard decider 1131 is the finally decoded value.

FIGS. 12A-12H are diagrams illustrating one example of a matrix arranged in each of the partial blocks included in a parity check matrix of a first type semi-systematic block LDPC code according to the present invention when a code rate is 1/2.

In FIGS. 12A-12H, a number illustrated in each of blocks represents exponent of each of permutation matrixes arranged in each of the blocks. It is assumed that the permutation matrix is expressed as $P^a$. If a=0, $P^0$ is an identity matrix. As the value of a increases, the permutation matrix is generated by cyclic-shifting a location of a value of 1 of each of rows on the identity matrix in a right direction. If a=−1, $P^{-1}$ is a zero matrix. Here, all elements of the zero matrix are '0'.

FIGS. 13A-13G are diagrams illustrating another example of a matrix arranged in each of the partial blocks included in a parity check matrix of a first type semi-systematic block LDPC code according to the present invention when a code rate is 1/2.

In FIGS. 13A-13G, a number illustrated in each of the blocks represents an exponent of each of permutation matrixes arranged in each of the blocks. It is assumed that the permutation matrix is expressed as pa. If a=0, $P^0$ is an identity matrix. As the value of a increases, the permutation matrix is generated by cyclic-shifting a location of a value of 1 of each of rows on the identity matrix in a right direction. If a=−1, $P^{-1}$ is a zero matrix. Here, all elements of the zero matrix are '0'.

FIGS. 14A-14B are diagrams illustrating one example of a matrix arranged in each of partial blocks included in a parity check matrix of a second type semi-systematic block LDPC code according to the present invention when a code rate is 5/6.

In FIGS. 14A-14B, a number illustrated in each of the blocks represents an exponent of each of permutation matrixes arranged in each of the blocks. It is assumed that the permutation matrix is expressed as $P^a$. If a=0, $P^0$ is an identity matrix. As the value of a increases, the permutation matrix is generated by cyclic-shifting a location of a value of 1 of each of rows on the identity matrix in a right direction. If a=−1, $P^{-1}$ is a zero matrix. Here, all elements of the zero matrix are '0'.

Figure 15A:
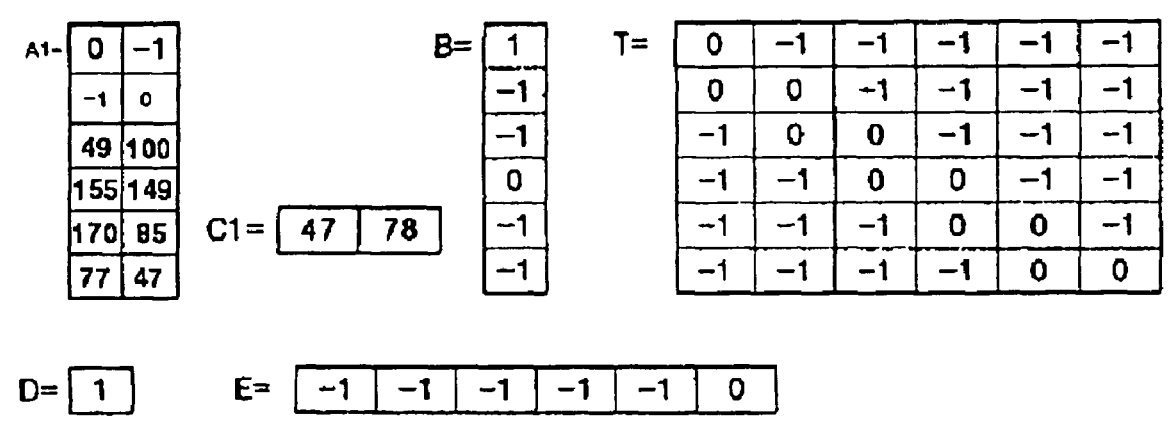

FIGS. 15A-15C are diagrams illustrating one example of a matrix arranged in each of the partial blocks included in a parity check matrix of a second type semi-systematic block LDPC code according to the present invention when a code rate is 11/12.

In FIGS. 15A-15C, a number illustrated in each of the blocks represents an exponent of each of permutation matrixes arranged in each of the blocks. It is assumed that the permutation matrix is expressed as pa. If a=0, $P^0$ is an identity matrix. As the value of a increases, the permutation matrix is generated by cyclic-shifting a location of a value of 1 of each of rows on the identity matrix in a right direction. If a=−1, $P^{-1}$ is a zero matrix. Here, all elements of the zero matrix are '0'.

Particularly, in FIGS. 15B and 15C, an arrow with a dotted oblique line indicates that the corresponding blocks are connected to each other. It should be noted that the partial blocks A2 and the partial blocks C2 shown in FIGS. 15B and 15C are divided to merely draw them in the same drawings.

Figures 16A, 16B:
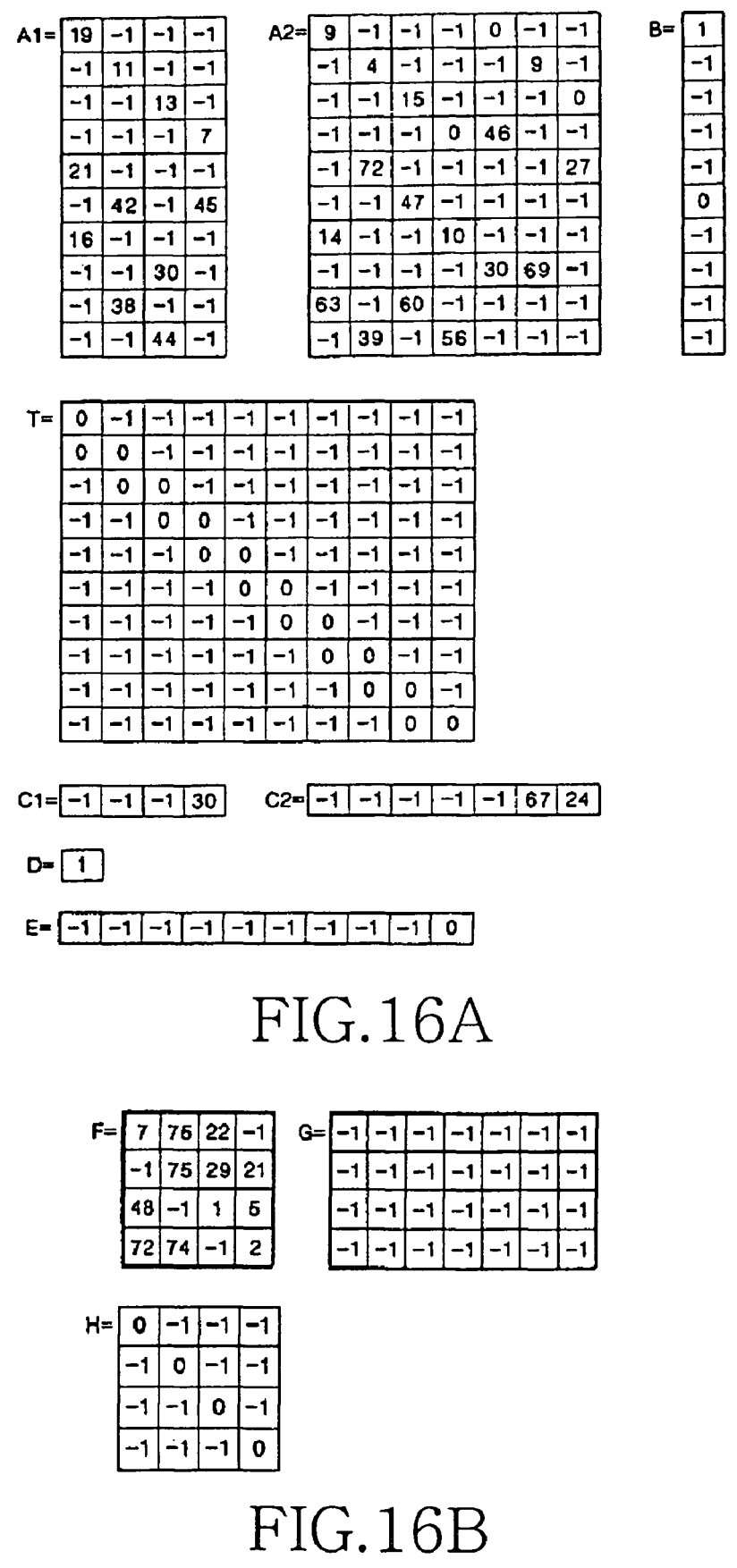

FIGS. 16A-16B are diagrams illustrating further another example of a matrix arranged in each of the partial blocks included in a parity check matrix of a first type semi-systematic block LDPC code according to the present invention when a code rate is 1/2.

In FIGS. 16A-16B, a number illustrated in each of the blocks represents an exponent of each of permutation matrixes arranged in each of the blocks. It is assumed that the permutation matrix is expressed as pa. If a=0, $P^0$ is an identity matrix. As the value of a increases, the permutation matrix is generated by cyclic-shifting a location of a value of 1 of each of rows on the identity matrix in a right direction. If a=−1, $P^{-1}$ is a zero matrix. Here, all elements of the zero matrix are '0'.

Figure 17:
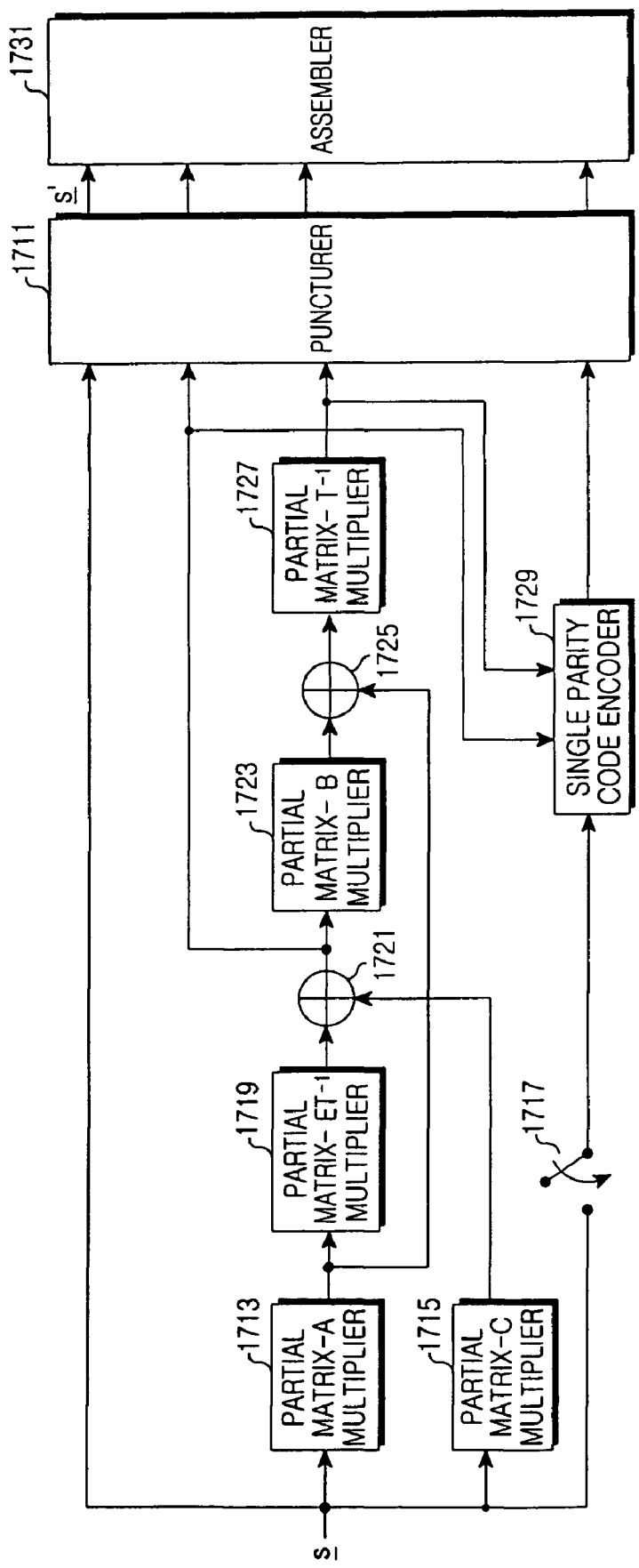
FIG. 17 is a diagram illustrating another internal structure of an encoder as illustrated in FIG. 1.

FIG. 17 is a diagram illustrating another internal structure of an encoder 111 as illustrated in FIG. 1.

In FIG. 17, the encoder 111 includes a puncturer 1711, a matrix-A multiplier 1713, a matrix-C multiplier 1715, a switch 1717, a matrix-$ET^{-1}$ multiplier 1719, an XOR operator 1721, a matrix-B multiplier 1723, an XOR operator 1725, a matrix-$T^{-1}$ multiplier 1727, a single parity check code encoder 1729, an assembler 1731 and a controller (not shown).

First, an operation of the controller will be described.

The controller selects one of a parent parity check matrix and a child parity check matrix corresponding to a code rate to be used in a signal transmission apparatus. The controller determines a matrix A, a matrix B, a matrix T, a matrix C, a matrix D, and a matrix E corresponding to the selected parity check matrix. The parent parity check matrix is one of a first type parent parity check matrix and a second type parent parity check matrix, and the child parity check matrix is one of a first type child parity check matrix and a second type child parity check matrix. The controller determines if there are information bits to be punctured among information bits of an information vector 's' corresponding to the selected parity check matrix. The controller determines whether it is necessary to generate a single parity code corresponding to the selected parity check matrix.

If an information vector 's' to be encoded is received, the information vector 's' is delivered to the puncturer 1711, the matrix-A multiplier 1713, the matrix-C multiplier 1715 and the switch 1717. The puncturer 1711 outputs the information vector 's' to the assembler 1731 by bypassing the information vector 's' under the control of the controller, or outputs a punctured information vector 's'' to the assembler 1731 under the control of the controller. The punctured information vector 's'' is generated by puncturing corresponding information bits among the information bits of the information vector 's'. The controller determines one of that the puncturer 1711 outputs the information vector 's' to the assembler 1731 corresponding to the selected parity check matrix, and the puncturer 1711 outputs the punctured information vector 's'' to the assembler 1731 corresponding to the selected parity check matrix.

Also, the controller controls an operation of the switch 1717 corresponding to the selected parity check matrix. The controller controls the switch 1717 to open when the selected parity check matrix is a parent parity check matrix, and controls the switch 1717 to close when the selected parity check matrix is a child parity check matrix.

The matrix-A multiplier 1713 multiplies the information vector 's' by the matrix A, and outputs the result to the matrix-$ET^{-1}$ multiplier 1719 and the XOR operator 1725. The matrix-$ET^{-1}$ multiplier 1719 multiplies the signal output from the matrix-A multiplier 1713 by the matrix $ET^{-1}$, and outputs the result to the XOR operator 1721. The matrix-C multiplier 1715 multiplies the information vector 's' by the matrix C, and outputs the result to the XOR operator 1721. The XOR operator 1721 performs an XOR operation on the signal output from the matrix-$ET^{-1}$ multiplier 1719 and the signal output from the matrix-C multiplier 1715, and outputs the result to the matrix-B multiplier 1723 and the puncturer 1711. The signal output from the XOR operator 1721 is a first parity vector 'p$_1$'.

The partial matrix-B multiplier 1023 multiplies the signal output from the XOR operator 1721 by the matrix B, and outputs the result to the XOR operator 1725. The XOR operator 1725 performs an XOR operation on the signal output from the matrix-A multiplier 1713 and the signal output from the matrix-B multiplier 1723, and outputs the result to the matrix-T$^{-1}$ multiplier 1727. The matrix-T$^{-1}$ multiplier 1727 multiplies the signal output from the XOR operator 1725 by the matrix T$^{-1}$, and outputs the result to the puncturer 1711. The signal output from the matrix-T$^{-1}$ multiplier 1727 is a second parity vector 'p$_2$'. Here, matrix-T$^{-1}$ multiply in each of the matrix-T$^{-1}$ multiplier 1727 can be performed using a back substitution scheme.

The puncturer 1711 outputs a first parity vector 'p$_1$' and a second parity vector 'p$_2$' to the assembler 1731 by bypassing the first parity vector 'p$_1$' and the second parity vector 'p$_2$' under the control of the controller, or outputs a first punctured parity vector to the assembler 1731 under the control of the controller. The first punctured parity vector is generated by puncturing corresponding parity bits among the parity bits of at least one of the first parity vector 'p$_1$' and the second parity vector 'p$_2$'. The controller determines one of that the puncturer 1711 outputs the first parity vector 'p$_1$' and the second parity vector 'p$_2$' to the assembler 1731 corresponding to the selected code rate, and the puncturer 1711 outputs the second punctured parity vector to the assembler 1731 corresponding to the selected code rate.

The switch 1717 performs a switching operation under the control of the controller, and the controller controls the switch 1717 to close to input the information vector 's' to the single parity code encoder 1729 when there is a need to generate a third parity vector 'p$_3$' or to generate the third parity vector 'p$_3$' and a fourth parity vector 'p$_4$'. The single parity code encoder 1729 generates a single parity codeword, that is, the third parity vector 'p$_3$' or the third parity vector 'p$_3$' and the fourth parity vector 'p$_4$' by encoding the signal output from the switch 1717, outputs the first parity vector 'p$_1$' and the second parity vector 'p$_2$', and outputs the result to the puncturer 1711.

The puncturer 1711 outputs the third parity vector 'p$_3$' and the fourth parity vector 'p$_4$' to the assembler 1731 by bypassing the third parity vector 'p$_3$' and the fourth parity vector 'p$_4$' under the control of the controller, or outputs a second punctured parity vector to the assembler 1731 under the control of the controller. Here, the second punctured parity vector is generated by puncturing corresponding parity bits among the parity bits of at least one of the third parity vector 'p$_3$' and the fourth parity vector 'p$_4$'. The controller determines one of that the puncturer 1711 outputs the third parity vector 'p$_3$' and the fourth parity vector 'p$_4$' to the assembler 1731 corresponding to the selected code rate, and the puncturer 1711 outputs the second punctured parity vector to the assembler 1731 corresponding to the selected code rate.

The assembler 1731 assembles the signal output from the puncturer 1711 under the control of the controller, and outputs the result as a codeword vector 'c'.

In FIG. 17, although the information vector 's', or the punctured information vector 's'', the first parity vector 'p$_1$', the second parity vector 'p$_2$', the fourth parity vector 'p$_4$' are generated in parallel according to the code rate, and then are assembled as a codeword vector 'c' using the generated vectors by way of example under the control of the controller, only the corresponding vectors among the information vector 's', or the punctured information vector 's'', the first parity vector 'p$_1$', the second parity vector 'p$_2$', the fourth parity vector 'p$_4$' can generated be sequentially according to the code rate, and then are assembled as the codeword vector 'c' using the generated vectors under the control of the controller.

In FIG. 17, the encoder 111 includes the puncturer 1711 by way of example. However, the puncturer 1711 does not perform a puncturing operation when a code rate to be used in the signal transmission apparatus is one of the parent code rate and the child code rate. Thus, if the signal transmission apparatus uses one of the parent code rate and the child code rate, the encoder 111 does not include the puncturer 1711.

As can be understood from the foregoing description, the present invention enables transmission/reception of signals in a communication system using a block LDPC code supporting a variable code rate. In addition, the present invention generates a plurality of child parity check matrixes from one parent parity check matrix according to a code rate, thereby enabling signal transmission/reception at a variable code rate with minimized complexity.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method to generate a parity check matrix of a block Low Density Parity Check (LDPC) code by a communication apparatus in a communication system, the method comprising:

generating, by the communication apparatus, at least one of a $1^{st}$ parity check matrix and a $2^{nd}$ parity check matrix used for encoding an information vector as the block LDPC code, wherein the $1^{st}$ parity check matrix is generated using a $2^{nd}$ parity check matrix, the $2^{nd}$ parity check matrix includes a plurality of blocks, the plurality of blocks are classified into blocks corresponding to an information part corresponding to the information vector, blocks corresponding to a $1^{st}$ parity part corresponding to a $1^{st}$ parity vector, blocks corresponding to a $2^{nd}$ parity part corresponding to a $2^{nd}$ parity vector, and blocks corresponding to a $3^{rd}$ parity part corresponding to a $3^{rd}$ parity vector, wherein when the information vector includes a $1^{st}$ information vector and a $2^{nd}$ information vector, the blocks classified as the information part are classified into blocks corresponding to a $1^{st}$ information part corresponding to the $1^{st}$ information vector and blocks corresponding to a $2^{nd}$ information part corresponding to the $2^{nd}$ information vector, wherein the blocks classified as the $1^{st}$ information part are classified into blocks corresponding to a $1^{st}$ partial block, blocks corresponding to a $2^{nd}$ partial block, and blocks corresponding to a $3^{rd}$ partial block, wherein the blocks classified as the $2^{nd}$ information part are classified into blocks corresponding to a $4^{th}$ partial block, blocks corresponding to a $5^{th}$ partial block, and blocks corresponding to a $6^{th}$ partial block, wherein the blocks classified as the $1^{st}$ parity part are classified into blocks corresponding to a $7^{th}$ partial block, blocks corresponding to a $8^{th}$ partial block, and blocks corresponding to a $9^{th}$ partial block, wherein the blocks classified as the $2^{nd}$ parity part are classified into blocks corresponding to a $10^{th}$ partial block, blocks corresponding to a $11^{th}$ partial block, and blocks corresponding to a $12^{th}$ partial block, wherein the blocks classified as the $3^{rd}$ parity part are classified into blocks corresponding to a $13^{th}$ partial block, blocks corresponding to a $14^{th}$ partial block, and blocks corresponding to a $15^{th}$ partial block, and wherein the $15^{th}$ partial block is diagonal with the $11^{th}$ partial block block-by-block, identity matrixes are arranged in blocks corresponding to the $15^{th}$ partial block.

2. The method of claim 1, wherein non-zero matrixes are arranged in blocks corresponding to the $3^{rd}$ partial block, and blocks corresponding to the $6^{th}$ partial block, and zero matrixes are arranged in blocks corresponding to the $9^{th}$ partial block, blocks corresponding to the $12^{th}$ partial block, blocks corresponding to the $13^{th}$ partial block, and blocks corresponding to the $14^{th}$ partial block.

3. The method of claim 1, wherein non-zero matrixes are arranged in blocks corresponding to the $3^{rd}$ partial block, blocks corresponding to the $6^{th}$ partial block, blocks corresponding to the $9^{th}$ partial block, blocks corresponding to the $12^{th}$ partial block, blocks corresponding to the $13^{th}$ partial block, and blocks corresponding to the $14^{th}$ partial block.

4. The method of claim 1, wherein the $1^{st}$ parity check matrix includes the $2^{nd}$ parity check matrix, a plurality of blocks included in the $1^{st}$ parity check matrix are classified into blocks corresponding to the $1^{st}$ information part, blocks corresponding to the $2^{nd}$ information part, blocks corresponding to the $1^{st}$ parity part, blocks corresponding to the $2^{nd}$ parity part, blocks corresponding to the $3^{rd}$ parity part, and blocks corresponding to a $4^{th}$ parity part corresponding to a $4^{th}$ parity vector, wherein the blocks classified as the $1^{st}$ information part are classified into blocks corresponding to the $1^{st}$ partial block, the $2^{nd}$ partial block, and the $3^{rd}$ partial block, and blocks corresponding to a $16^{th}$ partial block, wherein the blocks classified as the $2^{nd}$ information part are classified into blocks corresponding to the $4^{th}$ partial block, the $5^{th}$ partial block, and the $6^{th}$ partial block, and blocks corresponding to a $17^{th}$ partial block, wherein the blocks classified as the $1^{st}$ parity part are classified into blocks corresponding to the $7^{th}$ partial block, the $8^{th}$ partial block, and the $9^{th}$ partial block, and blocks corresponding to a $18^{th}$ partial block, wherein the blocks classified as the $2^{nd}$ parity part are classified into blocks corresponding to the $10^{th}$ partial block, the $11^{th}$ partial block, and the $12^{th}$ partial block, and blocks corresponding to a $19^{th}$ partial block, wherein the blocks classified as the $3^{rd}$ parity part are classified into blocks corresponding to the $13^{th}$ partial block, the $14^{th}$ partial block, and the $15^{th}$ partial block, and blocks corresponding to a $20^{th}$ partial block, wherein the blocks classified as the $4^{th}$ parity part are classified into blocks corresponding to a $21^{th}$ partial block, blocks corresponding to a $22^{th}$ partial block, blocks corresponding to a $23^{th}$ partial block, and blocks corresponding to a $24^{th}$ partial block, and wherein the $24^{th}$ partial block is diagonal with the $15^{th}$ partial block block-by-block, identity matrixes are arranged in blocks corresponding to the $24^{th}$ partial block.

5. The method of claim 4, wherein non-zero matrixes are arranged in blocks corresponding to the $3^{rd}$ partial block, blocks corresponding to the $6^{th}$ partial block, blocks corresponding to the $16^{th}$ partial block, and blocks corresponding to the $17^{th}$ partial block, and zero matrixes are arranged in blocks corresponding to the $9^{th}$ partial block, blocks corresponding to the $12^{th}$ partial block, blocks corresponding to the $13^{th}$ partial block, blocks corresponding to the $14^{th}$ partial block, blocks corresponding to the $18^{th}$ partial block, blocks corresponding to the $19^{th}$ partial block, blocks corresponding to the $20^{th}$ partial block, blocks corresponding to the $21^{th}$ partial block, blocks corresponding to the $22^{th}$ partial block, and blocks corresponding to the $23^{th}$ partial block.

6. The method of claim 4, wherein non-zero matrixes are arranged in blocks corresponding to the $3^{rd}$ partial block, blocks corresponding to the $6^{th}$ partial block, blocks corresponding to the $16^{th}$ partial block, blocks corresponding to the $17^{th}$ partial block, blocks corresponding to the $9^{th}$ partial block, blocks corresponding to the $12^{th}$ partial block, blocks corresponding to the $13^{th}$ partial block, blocks corresponding to the $14^{th}$ partial block, blocks corresponding to the $18^{th}$ partial block, blocks corresponding to the $19^{th}$ partial block, blocks corresponding to the $20^{th}$ partial block, blocks corresponding to the $21^{th}$ partial block, blocks corresponding to the $22^{th}$ partial block, and blocks corresponding to the $23^{th}$ partial block.

7. The method of claim 1, wherein a degree of a column of the $1^{st}$ information part is different from a degree of a column of the $2^{nd}$ information part.

8. A method to generate a parity check matrix of a block Low Density Parity Check (LDPC) code by a communication apparatus in a communication system, the method comprising:

generating, by the communication apparatus, at least one of a $1^{st}$ parity check matrix and a $2^{nd}$ parity check matrix used for encoding an information vector as the block LDPC code, wherein the $1^{st}$ parity check matrix is generated using a $2^{nd}$ parity check matrix, the $2^{nd}$ parity check matrix includes a plurality of blocks, the plurality of blocks are classified into blocks corresponding to an information part corresponding to the information vector, blocks corresponding to a $1^{st}$ parity part corresponding to a $1^{st}$ parity vector, and blocks corresponding to a $2^{nd}$ parity part corresponding to a $2^{nd}$ parity vector, wherein when the information vector includes a $1^{st}$ information vector and a $2^{nd}$ information vector, the blocks classified as the information part are classified into blocks corresponding to a $1^{st}$ information part corresponding to the $1^{st}$ information vector and blocks corresponding to a $2^{nd}$ information part corresponding to the $2^{nd}$ information vector, wherein the blocks classified as the $1^{st}$ information part are classified into blocks corresponding to a $1^{st}$ partial block, and blocks corresponding to a $2^{nd}$ partial block, wherein the blocks classified as the $2^{nd}$ information part are classified into blocks corresponding to a $3^{rd}$ partial block, and blocks corresponding to a $4^{th}$ partial block, wherein the blocks classified as the $1^{st}$ parity part are classified into blocks corresponding to a $5^{th}$ partial block, and blocks corresponding to a $6^{th}$ partial block, and wherein the blocks classified as the $2^{nd}$ parity part are classified into blocks corresponding to a $7^{th}$ partial block, and blocks corresponding to a $8^{th}$ partial block.

9. The method of claim 8, wherein the $1^{st}$ parity check matrix includes the $2^{nd}$ parity check matrix, a plurality of blocks included in the $1^{st}$ parity check matrix are classified into blocks corresponding to the $1^{st}$ information part, blocks corresponding to the $2^{nd}$ information part, blocks corresponding to the $1^{st}$ parity part, blocks corresponding to the $2^{nd}$ parity part, and blocks corresponding to the $3^{rd}$ parity part, wherein the blocks classified as the $1^{st}$ information part are classified into blocks corresponding to the $1^{st}$ partial block and the $2^{nd}$ partial block, and blocks corresponding to a $9^{th}$ partial block, wherein the blocks classified as the $2^{nd}$ information part are classified into blocks corresponding to the $3^{rd}$ partial block and the $4^{th}$ partial block, and blocks corresponding to a $10^{th}$ partial block, wherein the blocks classified as the $1^{st}$ parity part are classified into blocks corresponding to the $5^{th}$ partial block and the $6^{th}$ partial block, and blocks corresponding to a $11^{th}$ partial block, wherein the blocks classified as the $2^{nd}$ parity part are classified into blocks corresponding to the $7^{th}$ partial block and the $8^{th}$ partial block, and blocks corresponding to a $12^{th}$ partial block, wherein the blocks classified as the $3^{rd}$ parity part are classified into blocks corresponding to the $13^{th}$ partial block and the $14^{th}$ partial block, and blocks corresponding to a $15^{th}$ partial block, and wherein the $15^{th}$ partial block is diagonal with the $8^{th}$ partial block block-by-block, identity matrixes are arranged in blocks corresponding to the $15^{th}$ partial block.

10. The method of claim 8, wherein non-zero matrixes are arranged in blocks corresponding to the $9^{th}$ partial block, and blocks corresponding to the $10^{th}$ partial block, and zero matrixes are arranged in blocks corresponding to the $11^{th}$ partial block, blocks corresponding to the $12^{th}$ partial block, blocks corresponding to the $13^{th}$ partial block, and blocks corresponding to the $14^{th}$ partial block.

11. The method of claim 8, wherein non-zero matrixes are arranged in blocks corresponding to the $9^{th}$ partial block, blocks corresponding to the $10^{th}$ partial block, blocks corresponding to the $11^{th}$ partial block, blocks corresponding to the $12^{th}$ partial block, blocks corresponding to the $13^{th}$ partial block, and blocks corresponding to the $14^{th}$ partial block.

12. A method to encode a block Low Density Parity Check (LDPC) code by an encoder in a signal transmission apparatus, the method comprising:

generating, by the encoder, as a code rate of a $1^{st}$ parity check matrix a $1^{st}$ block LDPC codeword by encoding an information vector using the $1^{st}$ parity check matrix when a code rate to be used in the signal transmission apparatus is a $1^{st}$ code rate; and generating, by the encoder, as a code rate of a $2^{nd}$ parity check matrix a $2^{nd}$ block LDPC codeword by encoding the information vector using the $2^{nd}$ parity check matrix when a code rate to be used in the signal transmission apparatus is a $2^{nd}$ code rate, wherein the $1^{st}$ parity check matrix is generated using a $2^{nd}$ parity check matrix, the $2^{nd}$ parity check matrix includes a plurality of blocks, the plurality of blocks are classified into blocks corresponding to an information part corresponding to the information vector, blocks corresponding to a $1^{st}$ parity part corresponding to a $1^{st}$ parity vector, blocks corresponding to a $2^{nd}$ parity part corresponding to a $2^{nd}$ parity vector, and blocks corresponding to a $3^{rd}$ parity part corresponding to a $3^{rd}$ parity vector, wherein when the information vector includes a $1^{st}$ information vector and a $2^{nd}$ information vector, the blocks classified as the information part are classified into blocks corresponding to a $1^{st}$ information part corresponding to the $1^{st}$ information vector and blocks corresponding to a $2^{nd}$ information part corresponding to the $2^{nd}$ information vector, wherein the blocks classified as the $1^{st}$ information part are classified into blocks corresponding to a $1^{st}$ partial block, blocks corresponding to a $2^{nd}$ partial block, and blocks corresponding to a $3^{rd}$ partial block, wherein the blocks classified as the $2^{nd}$ information part are classified into blocks corresponding to a $4^{th}$ partial block, blocks corresponding to a $5^{th}$ partial block, and blocks corresponding to a $6^{th}$ partial block, wherein the blocks classified as the $1^{st}$ parity part are classified into blocks corresponding to a $7^{th}$ partial block, blocks corresponding to a $8^{th}$ partial block, and blocks corresponding to a $9^{th}$ partial block, wherein the blocks classified as the $2^{nd}$ parity part are classified into blocks corresponding to a $10^{th}$ partial block, blocks corresponding to a $11^{th}$ partial block, and blocks corresponding to a $12^{th}$ partial block, wherein the blocks classified as the $3^{rd}$ parity part are classified into blocks corresponding to a $13^{th}$ partial block, blocks corresponding to a $14^{th}$ partial block, and blocks corresponding to a $15^{th}$ partial block, and wherein the $15^{th}$ partial block is diagonal with the $11^{th}$ partial block block-by-block, identity matrixes are arranged in blocks corresponding to the $15^{th}$ partial block.

13. The method of claim 12, wherein non-zero matrixes are arranged in blocks corresponding to the $3^{rd}$ partial block, and blocks corresponding to the $6^{th}$ partial block, and zero matrixes are arranged in blocks corresponding to the $9^{th}$ partial block, blocks corresponding to the $12^{th}$ partial block, blocks corresponding to the $13^{th}$ partial block, and blocks corresponding to the $14^{th}$ partial block.

14. The method of claim 12, wherein non-zero matrixes are arranged in blocks corresponding to the $3^{rd}$ partial block, blocks corresponding to the $6^{th}$ partial block, blocks corresponding to the $9^{th}$ partial block, blocks corresponding to the $12^{th}$ partial block, blocks corresponding to the $13^{th}$ partial block, and blocks corresponding to the $14^{th}$ partial block.

15. The method of claim 12, wherein the $1^{st}$ parity check matrix includes the $2^{nd}$ parity check matrix, a plurality of blocks included in the $1^{st}$ parity check matrix are classified into blocks corresponding to the $1^{st}$ information part, blocks corresponding to the $2^{nd}$ information part, blocks corresponding to the $1^{st}$ parity part, blocks corresponding to the $2^{nd}$ parity part, blocks corresponding to the $3^{rd}$ parity part, and blocks corresponding to a $4^{th}$ parity part corresponding to a $4^{th}$ parity vector, wherein the blocks classified as the $1^{st}$ information part are classified into blocks corresponding to the $1^{st}$ partial block, the $2^{nd}$ partial block, and the $3^{rd}$ partial block, and blocks corresponding to a $16^{th}$ partial block, wherein the blocks classified as the $2^{nd}$ information part are classified into blocks corresponding to the $4^{th}$ partial block, the $5^{th}$ partial block, and the $6^{th}$ partial block, and blocks corresponding to a $17^{th}$ partial block, wherein the blocks classified as the $1^{st}$ parity part are classified into blocks corresponding to the $7^{th}$ partial block, the $8^{th}$ partial block, and the $9^{th}$ partial block, and blocks corresponding to a $18^{th}$ partial block, wherein the blocks classified as the $2^{nd}$ parity part are classified into blocks corresponding to the $10^{th}$ partial block, the $11^{th}$ partial block, and the $12^{th}$ partial block, and blocks corresponding to a $19^{th}$ partial block, wherein the blocks classified as the $3^{rd}$ parity part are classified into blocks corresponding to the $13^{th}$ partial block, the $14^{th}$ partial block, and the $15^{th}$ partial block, and blocks corresponding to a $20^{th}$ partial block, wherein the blocks classified as the $4^{th}$ parity part are classified into blocks corresponding to a $21^{th}$ partial block, blocks corresponding to a $22^{th}$ partial block, blocks corresponding to a 23$^{rd}$ partial block, and blocks corresponding to a 24$^{th}$ partial block, and wherein the 24$^{th}$ partial block is diagonal with the 15$^{th}$ partial block block-by-block, identity matrixes are arranged in blocks corresponding to the 24$^{th}$ partial block.

16. The method of claim 15, wherein non-zero matrixes are arranged in blocks corresponding to the 3$^{rd}$ partial block, blocks corresponding to the 6$^{th}$ partial block, blocks corresponding to the 16$^{th}$ partial block, and blocks corresponding to the 17$^{th}$ partial block, and zero matrixes are arranged in blocks corresponding to the 9$^{th}$ partial block, blocks corresponding to the 12$^{th}$ partial block, blocks corresponding to the 13$^{th}$ partial block, blocks corresponding to the 14$^{th}$ partial block, blocks corresponding to the 18$^{th}$ partial block, blocks corresponding to the 19$^{th}$ partial block, blocks corresponding to the 20$^{th}$ partial block, blocks corresponding to the 21$^{th}$ partial block, blocks corresponding to the 22$^{th}$ partial block, and blocks corresponding to the 23$^{th}$ partial block.

17. The method of claim 15, wherein non-zero matrixes are arranged in blocks corresponding to the 3$^{rd}$ partial block, blocks corresponding to the 6$^{th}$ partial block, blocks corresponding to the 16$^{th}$ partial block, blocks corresponding to the 17$^{th}$ partial block, blocks corresponding to the 9$^{th}$ partial block, blocks corresponding to the 12$^{th}$ partial block, blocks corresponding to the 13$^{th}$ partial block, blocks corresponding to the 14$^{th}$ partial block, blocks corresponding to the 18$^{th}$ partial block, blocks corresponding to the 19$^{th}$ partial block, blocks corresponding to the 20$^{th}$ partial block, blocks corresponding to the 21$^{th}$ partial block, blocks corresponding to the 22$^{th}$ partial block, and blocks corresponding to the 23$^{th}$ partial block.

18. The method of claim 12, wherein a degree of a column of the 1$^{st}$ information part is different from a degree of a column of the 2$^{nd}$ information part.

19. The method of claim 18, further comprising:
generating a 3$^{rd}$ block LDPC codeword by puncturing the 1$^{st}$ information vector included in the 2$^{nd}$ block LDPC codeword according to a 3$^{rd}$ code rate when the degree of a column of the 1$^{st}$ information part is greater than the degree of a column of the 2$^{nd}$ information part, and a code rate to be used in the signal transmission apparatus is the 3$^{rd}$ code rate,
wherein the 3$^{rd}$ code rate is less than the 2$^{nd}$ code rate.

20. The method of claim 18, further comprising:
generating a 4$^{th}$ block LDPC codeword by puncturing the 1$^{st}$ information vector included in the 1$^{st}$ block LDPC codeword according to a 4$^{th}$ code rate when the degree of a column of the 1$^{st}$ information part is greater than the degree of a column of the 2$^{nd}$ information part, and a code rate to be used in the signal transmission apparatus is the 4$^{th}$ code rate,
wherein the 4$^{th}$ code rate is less than the 1$^{st}$ code rate, and greater than the 2$^{nd}$ code rate.

21. A method to encode a block Low Density Parity Check (LDPC) code by an encoder in a signal transmission apparatus, the method comprising:
generating, by the encoder, as a code rate of a 1$^{st}$ parity check matrix a 1$^{st}$ block LDPC codeword by encoding an information vector using the 1$^{st}$ parity check matrix when a code rate to be used in the signal transmission apparatus is a 1$^{st}$ code rate; and
generating, by the encoder, as a code rate of a 2$^{nd}$ parity check matrix a 2$^{nd}$ block LDPC codeword by encoding the information vector using the 2$^{nd}$ parity check matrix when a code rate to be used in the signal transmission apparatus is a 2$^{nd}$ code rate, wherein the 1$^{st}$ parity check matrix is generated using a 2$^{nd}$ parity check matrix, the 2$^{nd}$ parity check matrix includes a plurality of blocks, the plurality of blocks are classified into blocks corresponding to an information part corresponding to the information vector, blocks corresponding to a 1$^{st}$ parity part corresponding to a 1$^{st}$ parity vector, and blocks corresponding to a 2$^{nd}$ parity part corresponding to a 2$^{nd}$ parity vector, wherein when the information vector includes a 1$^{st}$ information vector and a 2$^{nd}$ information vector, the blocks classified as the information part are classified into blocks corresponding to a 1$^{st}$ information part corresponding to the 1$^{st}$ information vector and blocks corresponding to a 2$^{nd}$ information part corresponding to the 2$^{nd}$ information vector, wherein the blocks classified as the 1$^{st}$ information part are classified into blocks corresponding to a 1$^{st}$ partial block, and blocks corresponding to a 2$^{nd}$ partial block, wherein the blocks classified as the 2$^{nd}$ information part are classified into blocks corresponding to a 3$^{rd}$ partial block, and blocks corresponding to a 4$^{th}$ partial block, wherein the blocks classified as the 1$^{st}$ parity part are classified into blocks corresponding to a 5$^{th}$ partial block, and blocks corresponding to a 6$^{th}$ partial block, and wherein the blocks classified as the 2$^{nd}$ parity part are classified into blocks corresponding to a 7$^{th}$ partial block, and blocks corresponding to a 8$^{th}$ partial block.

22. The method of claim 21, wherein the 1$^{st}$ parity check matrix includes the 2$^{nd}$ parity check matrix, a plurality of blocks included in the 1$^{st}$ parity check matrix are classified into blocks corresponding to the 1$^{st}$ information part, blocks corresponding to the 2$^{nd}$ information part, blocks corresponding to the 1$^{st}$ parity part, blocks corresponding to the 2$^{nd}$ parity part, and blocks corresponding to the 3$^{rd}$ parity part, wherein the blocks classified as the 1$^{st}$ information part are classified into blocks corresponding to the 1$^{st}$ partial block and the 2$^{nd}$ partial block, and blocks corresponding to a 9$^{th}$ partial block, wherein the blocks classified as the 2$^{nd}$ information part are classified into blocks corresponding to the 3$^{th}$ partial block and the 4$^{th}$ partial block, and blocks corresponding to a 10$^{th}$ partial block, wherein the blocks classified as the 1$^{st}$ parity part are classified into blocks corresponding to the 5$^{th}$ partial block and the 6$^{th}$ partial block, and blocks corresponding to a 11$^{th}$ partial block, wherein the blocks classified as the 2$^{nd}$ parity part are classified into blocks corresponding to the 7$^{th}$ partial block and the 8$^{th}$ partial block, and blocks corresponding to a 12$^{th}$ partial block, wherein the blocks classified as the 3$^{rd}$ parity part are classified into blocks corresponding to the 13$^{th}$ partial block and the 14$^{th}$ partial block, and blocks corresponding to a 15$^{th}$ partial block, and wherein the 15$^{th}$ partial block is diagonal with the 8$^{th}$ partial block block-by-block, identity matrixes are arranged in blocks corresponding to the 15$^{th}$ partial block.

23. The method of claim 21, wherein non-zero matrixes are arranged in blocks corresponding to the 9$^{th}$ partial block, and blocks corresponding to the 10$^{th}$ partial block, and zero matrixes are arranged in blocks corresponding to the 11$^{th}$ partial block, blocks corresponding to the 12$^{th}$ partial block, blocks corresponding to the 13$^{th}$ partial block, and blocks corresponding to the 14$^{th}$ partial block.

24. The method of claim 21, wherein non-zero matrixes are arranged in blocks corresponding to the 9$^{th}$ partial block, blocks corresponding to the 10$^{th}$ partial block, blocks corresponding to the 11$^{th}$ partial block, blocks corresponding to the 12$^{th}$ partial block, blocks corresponding to the 13$^{th}$ partial block, and blocks corresponding to the 14$^{th}$ partial block.

25. The method of claim 21, wherein a degree of a column of the 1$^{st}$ information part is different from a degree of a column of the 2$^{nd}$ information part.

26. The method of claim 25, further comprising:
generating a 3$^{rd}$ block LDPC codeword by puncturing the 1$^{st}$ information vector included in the 2$^{nd}$ block LDPC codeword according to a 3$^{rd}$ code rate when the degree of a column of the 1$^{st}$ information part is greater than the degree of a column of the 2$^{nd}$ information part, and a code rate to be used in the signal transmission apparatus is the 3$^{rd}$ code rate,
wherein the 3$^{rd}$ code rate is less than the 2$^{nd}$ code rate.

27. The method of claim 25, further comprising:
generating a 4$^{th}$ block LDPC codeword by puncturing the 1$^{st}$ information vector included in the 1$^{st}$ block LDPC codeword according to a 4$^{th}$ code rate when the degree of a column of the 1$^{st}$ information part is greater than the degree of a column of the 2$^{nd}$ information part, and a code rate to be used in the signal transmission apparatus is the 4$^{th}$ code rate,
wherein the 4$^{th}$ code rate is less than the 1$^{st}$ code rate, and greater than the 2$^{nd}$ code rate.

28. An apparatus to encode a block Low Density Parity Check (LDPC) code in a signal transmission apparatus, the apparatus comprising:
an encoder to generate as a code rate of a 1$^{st}$ parity check matrix a 1$^{st}$ block LDPC codeword by encoding an information vector using the 1$^{st}$ parity check matrix when a code rate to be used in the signal transmission apparatus is a 1$^{st}$ code rate, and generate as a code rate of a 2$^{nd}$ parity check matrix a 2$^{nd}$ block LDPC codeword by encoding the information vector using the 2$^{nd}$ parity check matrix when a code rate to be used in the signal transmission apparatus is a 2$^{nd}$ code rate,
wherein the 1$^{st}$ parity check matrix is generated using a 2$^{nd}$ parity check matrix, the 2$^{nd}$ parity check matrix includes a plurality of blocks, the plurality of blocks are classified into blocks corresponding to an information part corresponding to the information vector, blocks corresponding to a 1$^{st}$ parity part corresponding to a 1$^{st}$ parity vector, blocks corresponding to a 2$^{nd}$ parity part corresponding to a 2$^{nd}$ parity vector, and blocks corresponding to a 3$^{rd}$ parity part corresponding to a 3$^{rd}$ parity vector,
wherein when the information vector includes a 1$^{st}$ information vector and a 2$^{nd}$ information vector, the blocks classified as the information part are classified into blocks corresponding to a 1$^{st}$ information part corresponding to the 1$^{st}$ information vector and blocks corresponding to a 2$^{nd}$ information part corresponding to the 2$^{nd}$ information vector,
wherein the blocks classified as the 1$^{st}$ information part are classified into blocks corresponding to a 1$^{st}$ partial block, blocks corresponding to a 2$^{nd}$ partial block, and blocks corresponding to a 3$^{rd}$ partial block,
wherein the blocks classified as the 2$^{nd}$ information part are classified into blocks corresponding to a 4$^{th}$ partial block, blocks corresponding to a 5$^{th}$ partial block, and blocks corresponding to a 6$^{th}$ partial block,
wherein the blocks classified as the 1$^{st}$ parity part are classified into blocks corresponding to a 7$^{th}$ partial block, blocks corresponding to a 8$^{th}$ partial block, and blocks corresponding to a 9$^{th}$ partial block,
wherein the blocks classified as the 2$^{nd}$ parity part are classified into blocks corresponding to a 10$^{th}$ partial block, blocks corresponding to a 11$^{th}$ partial block, and blocks corresponding to a 12$^{th}$ partial block,
wherein the blocks classified as the 3$^{rd}$ parity part are classified into blocks corresponding to a 13$^{th}$ partial block, blocks corresponding to a 14$^{th}$ partial block, and blocks corresponding to a 15$^{th}$ partial block, and
wherein the 15$^{th}$ partial block is diagonal with the 11$^{th}$ partial block block-by-block, identity matrixes are arranged in blocks corresponding to the 15$^{th}$ partial block.

29. The apparatus of claim 28, wherein non-zero matrixes are arranged in blocks corresponding to the 3$^{rd}$ partial block, and blocks corresponding to the 6$^{th}$ partial block, and zero matrixes are arranged in blocks corresponding to the 9$^{th}$ partial block, blocks corresponding to the 12$^{th}$ partial block, blocks corresponding to the 13$^{th}$ partial block, and blocks corresponding to the 14$^{th}$ partial block.

30. The apparatus of claim 28, wherein non-zero matrixes are arranged in blocks corresponding to the 3$^{rd}$ partial block, blocks corresponding to the 6$^{th}$ partial block, blocks corresponding to the 9$^{th}$ partial block, blocks corresponding to the 12$^{th}$ partial block, blocks corresponding to the 13$^{th}$ partial block, and blocks corresponding to the 14$^{th}$ partial block.

31. The apparatus of claim 28, wherein the 1$^{st}$ parity check matrix includes the 2$^{nd}$ parity check matrix, a plurality of blocks included in the 1$^{st}$ parity check matrix are classified into blocks corresponding to the 1$^{st}$ information part, blocks corresponding to the 2$^{nd}$ information part, blocks corresponding to the 1$^{st}$ parity part, blocks corresponding to the 2$^{nd}$ parity part, blocks corresponding to the 3$^{rd}$ parity part, and blocks corresponding to a 4$^{th}$ parity part corresponding to a 4$^{th}$ parity vector,
wherein the blocks classified as the 1$^{st}$ information part are classified into blocks corresponding to the 1$^{st}$ partial block, the 2$^{nd}$ partial block, and the 3$^{rd}$ partial block, and blocks corresponding to a 16$^{th}$ partial block,
wherein the blocks classified as the 2$^{nd}$ information part are classified into blocks corresponding to the 4$^{th}$ partial block, the 5$^{th}$ partial block, and the 6$^{th}$ partial block, and blocks corresponding to a 17$^{th}$ partial block,
wherein the blocks classified as the 1$^{st}$ parity part are classified into blocks corresponding to the 7$^{th}$ partial block, the 8$^{th}$ partial block, and the 9$^{th}$ partial block, and blocks corresponding to a 18$^{th}$ partial block,
wherein the blocks classified as the 2$^{nd}$ parity part are classified into blocks corresponding to the 10$^{th}$ partial block, the 11$^{th}$ partial block, and the 12$^{th}$ partial block, and blocks corresponding to a 19$^{th}$ partial block,
wherein the blocks classified as the 3$^{rd}$ parity part are classified into blocks corresponding to the 13$^{th}$ partial block, the 14$^{th}$ partial block, and the 15$^{th}$ partial block, and blocks corresponding to a 20$^{th}$ partial block,
wherein the blocks classified as the 4$^{th}$ parity part are classified into blocks corresponding to a 21$^{th}$ partial block, blocks corresponding to a 22$^{th}$ partial block, blocks corresponding to a 23$^{th}$ partial block, and blocks corresponding to a 24$^{th}$ partial block, and
wherein the 24$^{th}$ partial block is diagonal with the 15$^{th}$ partial block block-by-block, identity matrixes are arranged in blocks corresponding to the 24$^{th}$ partial block.

32. The apparatus of claim 31, wherein non-zero matrixes are arranged in blocks corresponding to the 3$^{rd}$ partial block, blocks corresponding to the 6$^{th}$ partial block, blocks corresponding to the 16$^{th}$ partial block, and blocks corresponding to the 17$^{th}$ partial block, and zero matrixes are arranged in blocks corresponding to the 9$^{th}$ partial block, blocks corresponding to the 12$^{th}$ partial block, blocks corresponding to the 13$^{th}$ partial block, blocks corresponding to the 14$^{th}$ partial block, blocks corresponding to the 18$^{th}$ partial block, blocks corresponding to the 19$^{th}$ partial block, blocks corresponding to the 20$^{th}$ partial block, blocks corresponding to the 21$^{th}$ partial block, and blocks corresponding to the 22$^{th}$ partial block, blocks corresponding to the 23$^{th}$ partial block.

33. The apparatus of claim 31, wherein non-zero matrixes are arranged in blocks corresponding to the 3$^{rd}$ partial block, blocks corresponding to the 6$^{th}$ partial block, blocks corresponding to the 16$^{th}$ partial block, blocks corresponding to the 17$^{th}$ partial block, blocks corresponding to the 9$^{th}$ partial block, blocks corresponding to the 12$^{th}$ partial block, blocks corresponding to the 13$^{th}$ partial block, blocks corresponding to the 14$^{th}$ partial block, blocks corresponding to the 18$^{th}$ partial block, blocks corresponding to the 19$^{th}$ partial block, blocks corresponding to the 20$^{th}$ partial block, blocks corresponding to the 21$^{th}$ partial block, blocks corresponding to the 22$^{th}$ partial block, and blocks corresponding to the 23$^{th}$ partial block.

34. The apparatus of claim 28, wherein a degree of a column of the 1$^{st}$ information part is different from a degree of a column of the 2$^{nd}$ information part.

35. The apparatus of claim 34, wherein the encoder generates a 3$^{rd}$ block LDPC codeword by puncturing the 1$^{st}$ information vector included in the 2$^{nd}$ block LDPC codeword according to a 3$^{rd}$ code rate when the degree of a column of the 1$^{st}$ information part is greater than the degree of a column of the 2$^{nd}$ information part, and a code rate to be used in the signal transmission apparatus is the 3$^{rd}$ code rate,
wherein the 3$^{rd}$ code rate is less than the 2$^{nd}$ code rate.

36. The apparatus of claim 34, wherein the encoder generates a 4$^{th}$ block LDPC codeword by puncturing the 1$^{st}$ information vector included in the 1$^{st}$ block LDPC codeword according to a 4$^{th}$ code rate when the degree of a column of the 1$^{st}$ information part is greater than the degree of a column of the 2$^{nd}$ information part, and a code rate to be used in the signal transmission apparatus is the 4$^{th}$ code rate, and
wherein the 4$^{th}$ code rate is less than the 1$^{st}$ code rate, and greater than the 2$^{nd}$ code rate.

37. An apparatus to encode a block Low Density Parity Check (LDPC) code in a signal transmission apparatus, the apparatus comprising:
an encoder to generate as a code rate of a 1$^{st}$ parity check matrix a 1$^{st}$ block LDPC codeword by encoding an information vector using the 1$^{st}$ parity check matrix when a code rate to be used in the signal transmission apparatus is a 1$^{st}$ code rate, and generate as a code rate of a 2$^{nd}$ parity check matrix a 2$^{nd}$ block LDPC codeword by encoding the information vector using the 2$^{nd}$ parity check matrix when a code rate to be used in the signal transmission apparatus is a 2$^{nd}$ code rate,
wherein the 1$^{st}$ parity check matrix is generated using a 2$^{nd}$ parity check matrix, the 2$^{nd}$ parity check matrix includes a plurality of blocks, the plurality of blocks are classified into blocks corresponding to an information part corresponding to the information vector, blocks corresponding to a 1$^{st}$ parity part corresponding to a 1$^{st}$ parity vector, and blocks corresponding to a 2$^{nd}$ parity part corresponding to a 2$^{nd}$ parity vector,
wherein when the information vector includes a 1$^{st}$ information vector and a 2$^{nd}$ information vector, the blocks classified as the information part are classified into blocks corresponding to a 1$^{st}$ information part corresponding to the 1$^{st}$ information vector and blocks corresponding to a 2$^{nd}$ information part corresponding to the 2$^{nd}$ information vector, wherein the blocks classified as the 1$^{st}$ information part are classified into blocks corresponding to a 1$^{st}$ partial block, and blocks corresponding to a 2$^{nd}$ partial block,
wherein the blocks classified as the 2$^{nd}$ information part are classified into blocks corresponding to a 3$^{rd}$ partial block, and blocks corresponding to a 4$^{th}$ partial block,
wherein the blocks classified as the 1$^{st}$ parity part are classified into blocks corresponding to a 5$^{th}$ partial block, and blocks corresponding to a 6$^{th}$ partial block, and
wherein the blocks classified as the 2$^{nd}$ parity part are classified into blocks corresponding to a 7$^{th}$ partial block, and blocks corresponding to a 8$^{th}$ partial block.

38. The apparatus of claim 37, wherein the 1$^{st}$ parity check matrix includes the 2$^{nd}$ parity check matrix, a plurality of blocks included in the 1$^{st}$ parity check matrix are classified into blocks corresponding to the 1$^{st}$ information part, blocks corresponding to the 2$^{nd}$ information part, blocks corresponding to the 1$^{st}$ parity part, blocks corresponding to the 2$^{nd}$ parity part, and blocks corresponding to the 3$^{rd}$ parity part,
wherein the blocks classified as the 1$^{st}$ information part are classified into blocks corresponding to the 1$^{st}$ partial block and the 2$^{nd}$ partial block, and blocks corresponding to a 9$^{th}$ partial block,
wherein the blocks classified as the 2$^{nd}$ information part are classified into blocks corresponding to the 3$^{th}$ partial block and the 4$^{th}$ partial block, and blocks corresponding to a 10$^{th}$ partial block,
wherein the blocks classified as the 1$^{st}$ parity part are classified into blocks corresponding to the 5$^{th}$ partial block and the 6$^{th}$ partial block, and blocks corresponding to a 11$^{th}$ partial block,
wherein the blocks classified as the 2$^{nd}$ parity part are classified into blocks corresponding to the 7$^{th}$ partial block and the 8$^{th}$ partial block, and blocks corresponding to a 12$^{th}$ partial block,
wherein the blocks classified as the 3$^{rd}$ parity part are classified into blocks corresponding to the 13$^{th}$ partial block and the 14$^{th}$ partial block, and blocks corresponding to a 15$^{th}$ partial block, and
wherein the 15$^{th}$ partial block is diagonal with the 8$^{th}$ partial block block-by-block, identity matrixes are arranged in blocks corresponding to the 15$^{th}$ partial block.

39. The apparatus of claim 37, wherein non-zero matrixes are arranged in blocks corresponding to the 9$^{th}$ partial block, and blocks corresponding to the 10$^{th}$ partial block, and zero matrixes are arranged in blocks corresponding to the 11$^{th}$ partial block, blocks corresponding to the 12$^{th}$ partial block, blocks corresponding to the 13$^{th}$ partial block, and blocks corresponding to the 14$^{th}$ partial block.

40. The apparatus of claim 37, wherein non-zero matrixes are arranged in blocks corresponding to the 9$^{th}$ partial block, blocks corresponding to the 10$^{th}$ partial block, blocks corresponding to the 11$^{th}$ partial block, blocks corresponding to the 12$^{th}$ partial block, blocks corresponding to the 13$^{th}$ partial block, and blocks corresponding to the 14$^{th}$ partial block.

41. The apparatus of claim 37, wherein a degree of a column of the 1$^{st}$ information part is different from a degree of a column of the 2$^{nd}$ information part.

42. The apparatus of claim 41, wherein the encoder generates a 3$^{rd}$ block LDPC codeword by puncturing the 1$^{st}$ information vector included in the 2$^{nd}$ block LDPC codeword according to a 3$^{rd}$ code rate when the degree of a column of the 1$^{st}$ information part is greater than the degree of a column of the 2$^{nd}$ information part, and a code rate to be used in the signal transmission apparatus is the 3$^{rd}$ code rate,
wherein the 3$^{rd}$ code rate is less than the 2$^{nd}$ code rate.

43. The apparatus of claim 41, wherein the encoder generates a $4^{th}$ block LDPC codeword by puncturing the $1^{st}$ information vector included in the $1^{st}$ block LDPC codeword according to a $4^{th}$ code rate when the degree of a column of the $1^{st}$ information part is greater than the degree of a column of the $2^{nd}$ information part, and a code rate to be used in the signal transmission apparatus is the $4^{th}$ code rate,
wherein the $4^{th}$ code rate is less than the $1^{st}$ code rate, and greater than the $2^{nd}$ code rate.

44. A method to decode a block Low Density Parity Check (LDPC) code by a decoder in a signal reception apparatus, the method comprising:
detecting, by the decoder, an information vector by decoding as a code rate of a $2^{nd}$ parity check matrix a reception signal using a $1^{st}$ parity check matrix when a code rate used in a signal transmission apparatus is the $1^{st}$ code rate; and
detecting, by the decoder, the information vector by decoding as a code rate of a $1^{st}$ parity check matrix the reception signal using the $2^{nd}$ parity check matrix when a code rate used in the signal transmission apparatus is a $2^{nd}$ code rate,
wherein the $1^{st}$ parity check matrix is generated using a $2^{nd}$ parity check matrix, the $2^{nd}$ parity check matrix includes a plurality of blocks, the plurality of blocks are classified into blocks corresponding to an information part corresponding to the information vector, blocks corresponding to a $1^{st}$ parity part corresponding to a $1^{st}$ parity vector, blocks corresponding to a $2^{nd}$ parity part corresponding to a $2^{nd}$ parity vector, and blocks corresponding to a $3^{rd}$ parity part corresponding to a $3^{rd}$ parity vector,
wherein when the information vector includes a $1^{st}$ information vector and a $2^{nd}$ information vector, the blocks classified as the information part are classified into blocks corresponding to a $1^{st}$ information part corresponding to the $1^{st}$ information vector and blocks corresponding to a $2^{nd}$ information part corresponding to the $2^{nd}$ information vector,
wherein the blocks classified as the $1^{st}$ information part are classified into blocks corresponding to a $1^{st}$ partial block, blocks corresponding to a $2^{nd}$ partial block, and blocks corresponding to a $3^{rd}$ partial block,
wherein the blocks classified as the $2^{nd}$ information part are classified into blocks corresponding to a $4^{th}$ partial block, blocks corresponding to a $5^{th}$ partial block, and blocks corresponding to a $6^{th}$ partial block,
wherein the blocks classified as the $1^{st}$ parity part are classified into blocks corresponding to a $7^{th}$ partial block, blocks corresponding to a $8^{th}$ partial block, and blocks corresponding to a $9^{th}$ partial block,
wherein the blocks classified as the $2^{nd}$ parity part are classified into blocks corresponding to a $10^{th}$ partial block, blocks corresponding to a $11^{th}$ partial block, and blocks corresponding to a $12^{th}$ partial block,
wherein the blocks classified as the $3^{rd}$ parity part are classified into blocks corresponding to a $13^{th}$ partial block, blocks corresponding to a $14^{th}$ partial block, and blocks corresponding to a $15^{th}$ partial block, and
wherein the $15^{th}$ partial block is diagonal with the $11^{th}$ partial block block-by-block, identity matrixes are arranged in blocks corresponding to the $15^{th}$ partial block.

45. The method of claim 44, wherein non-zero matrixes are arranged in blocks corresponding to the $3^{rd}$ partial block, and blocks corresponding to the $6^{th}$ partial block, and zero matrixes are arranged in blocks corresponding to the $9^{th}$ partial block, blocks corresponding to the $12^{th}$ partial block, blocks corresponding to the $13^{th}$ partial block, and blocks corresponding to the $14^{th}$ partial block.

46. The method of claim 44, wherein non-zero matrixes are arranged in blocks corresponding to the $3^{rd}$ partial block, blocks corresponding to the $6^{th}$ partial block, blocks corresponding to the $9^{th}$ partial block, blocks corresponding to the $12^{th}$ partial block, blocks corresponding to the $13^{th}$ partial block, and blocks corresponding to the $14^{th}$ partial block.

47. The method of claim 44, wherein the $1^{st}$ parity check matrix includes the $2^{nd}$ parity check matrix, a plurality of blocks included in the $1^{st}$ parity check matrix are classified into blocks corresponding to the $1^{st}$ information part, blocks corresponding to the $2^{nd}$ information part, blocks corresponding to the $1^{st}$ parity part, blocks corresponding to the $2^{nd}$ parity part, blocks corresponding to the $3^{rd}$ parity part, and blocks corresponding to a $4^{th}$ parity part corresponding to a $4^{th}$ parity vector,
wherein the blocks classified as the $1^{st}$ information part are classified into blocks corresponding to the $1^{st}$ partial block, the $2^{nd}$ partial block, and the $3^{rd}$ partial block, and blocks corresponding to a $16^{th}$ partial block,
wherein the blocks classified as the $2^{nd}$ information part are classified into blocks corresponding to the $4^{th}$ partial block, the $5^{th}$ partial block, and the $6^{th}$ partial block, and blocks corresponding to a $17^{th}$ partial block,
wherein the blocks classified as the $1^{st}$ parity part are classified into blocks corresponding to the $7^{th}$ partial block, the $8^{th}$ partial block, and the $9^{th}$ partial block, and blocks corresponding to a $18^{th}$ partial block,
wherein the blocks classified as the $2^{nd}$ parity part are classified into blocks corresponding to the $10^{th}$ partial block, the $11^{th}$ partial block, and the $12^{th}$ partial block, and blocks corresponding to a $19^{th}$ partial block,
wherein the blocks classified as the $3^{rd}$ parity part are classified into blocks corresponding to the $13^{th}$ partial block, the $14^{th}$ partial block, and the $15^{th}$ partial block, and blocks corresponding to a $20^{th}$ partial block,
wherein the blocks classified as the $4^{th}$ parity part are classified into blocks corresponding to a $21^{th}$ partial block, blocks corresponding to a $22^{th}$ partial block, blocks corresponding to a $23^{th}$ partial block, and blocks corresponding to a $24^{th}$ partial block, and
wherein the $24^{th}$ partial block is diagonal with the $15^{th}$ partial block block-by-block, identity matrixes are arranged in blocks corresponding to the $24^{th}$ partial block.

48. The method of claim 47, wherein non-zero matrixes are arranged in blocks corresponding to the $3^{rd}$ partial block, blocks corresponding to the $6^{th}$ partial block, blocks corresponding to the $16^{th}$ partial block, and blocks corresponding to the $17^{th}$ partial block, and zero matrixes are arranged in blocks corresponding to the $9^{th}$ partial block, blocks corresponding to the $12^{th}$ partial block, blocks corresponding to the $13^{th}$ partial block, blocks corresponding to the $14^{th}$ partial block, blocks corresponding to the $18^{th}$ partial block, blocks corresponding to the $19^{th}$ partial block, blocks corresponding to the $20^{th}$ partial block, blocks corresponding to the $21^{th}$ partial block, blocks corresponding to the $22^{th}$ partial block, and blocks corresponding to the $23^{th}$ partial block.

49. The method of claim 47, wherein non-zero matrixes are arranged in blocks corresponding to the $3^{rd}$ partial block, blocks corresponding to the $6^{th}$ partial block, blocks corresponding to the $16^{th}$ partial block, blocks corresponding to the $17^{th}$ partial block, blocks corresponding to the $9^{th}$ partial block, blocks corresponding to the $12^{th}$ partial block, blocks corresponding to the $13^{th}$ partial block, blocks corresponding to the $14^{th}$ partial block, blocks corresponding to the $18^{th}$ partial block, blocks corresponding to the 19th partial block, blocks corresponding to the 20th partial block, blocks corresponding to the 21th partial block, blocks corresponding to the 22th partial block, and blocks corresponding to the 23th partial block.

50. The method of claim 44, wherein a degree of a column of the 1st information part is different from a degree of a column of the 2nd information part.

51. The method of claim 50, further comprising:
inserting zero into a predetermined position of the reception signal; and
detecting the information vector by decoding the zero inserted signal using the 2nd parity check matrix,
when the degree of a column of the 1st information part is greater than the degree of a column of the 2nd information part, and a code rate to be used in the signal transmission apparatus is a 3rd code rate,
wherein the 3rd code rate is less than the 2nd code rate.

52. The method of claim 50, further comprising:
inserting zero into a predetermined position of the reception signal; and
detecting the information vector by decoding the zero inserted signal using the 1st parity check matrix,
when the degree of a column of the 1st information part is greater than the degree of a column of the 2nd information part, and a code rate to be used in the signal transmission apparatus is the 4th code rate,
wherein the 4th code rate is less than the 1st code rate, and greater than the 2nd code rate.

53. A method to decode a block Low Density Parity Check (LDPC) code by a decoder in a signal reception apparatus, the method comprising:
detecting, by the decoder, an information vector by decoding as a code rate of a 1st parity check matrix a reception signal using the 1st parity check matrix when a code rate used in a signal transmission apparatus is a 1st code rate; and
detecting, by the decoder, the information vector by decoding as a code rate of a 2nd parity check matrix the reception signal using the 2nd parity check matrix when a code rate used in the signal transmission apparatus is a 2nd code rate,
wherein when the information vector includes a 1st information vector and a 2nd information vector, the blocks classified as the information part are classified into blocks corresponding to a 1st information part corresponding to the 1st information vector and blocks corresponding to a 2nd information part corresponding to the 2nd information vector,
wherein the blocks classified as the 1st information part are classified into blocks corresponding to a 1st partial block, and blocks corresponding to a 2nd partial block,
wherein the blocks classified as the 2nd information part are classified into blocks corresponding to a 3rd partial block, and blocks corresponding to a 4th partial block,
wherein the blocks classified as the 1st parity part are classified into blocks corresponding to a 5th partial block, and blocks corresponding to a 6th partial block, and
wherein the blocks classified as the 2nd parity part are classified into blocks corresponding to a 7th partial block, and blocks corresponding to a 8th partial block.

54. The method of claim 53, wherein the 1st parity check matrix includes the 2nd parity check matrix, a plurality of blocks included in the 1st parity check matrix are classified into blocks corresponding to the 1st information part, blocks corresponding to the 2nd information part, blocks corresponding to the 1st parity part, blocks corresponding to the 2nd parity part, and blocks corresponding to the 3rd parity part,
wherein the blocks classified as the 1st information part are classified into blocks corresponding to the 1st partial block and the 2nd partial block, and blocks corresponding to a 9th partial block,
wherein the blocks classified as the 2nd information part are classified into blocks corresponding to the 3rd partial block and the 4th partial block, and blocks corresponding to a 10th partial block,
wherein the blocks classified as the 1st parity part are classified into blocks corresponding to the 5th partial block and the 6th partial block, and blocks corresponding to a 11th partial block,
wherein the blocks classified as the 2nd parity part are classified into blocks corresponding to the 7th partial block and the 8th partial block, and blocks corresponding to a 12th partial block,
wherein the blocks classified as the 3rd parity part are classified into blocks corresponding to the 13th partial block and the 14th partial block, and blocks corresponding to a 15th partial block, and
wherein the 15th partial block is diagonal with the 8th partial block block-by-block, identity matrixes are arranged in blocks corresponding to the 15th partial block.

55. The method of claim 53, wherein non-zero matrixes are arranged in blocks corresponding to the 9th partial block, and blocks corresponding to the 10th partial block, and zero matrixes are arranged in blocks corresponding to the 11th partial block, blocks corresponding to the 12th partial block, blocks corresponding to the 13th partial block, and blocks corresponding to the 14th partial block.

56. The method of claim 53, wherein non-zero matrixes are arranged in blocks corresponding to the 9th partial block, blocks corresponding to the 10th partial block, blocks corresponding to the 11th partial block, blocks corresponding to the 12th partial block, blocks corresponding to the 13th partial block, and blocks corresponding to the 14th partial block.

57. The method of claim 53, wherein a degree of a column of the 1st information part is different from a degree of a column of the 2nd information part.

58. The method of claim 57, further comprising:
inserting zero into a predetermined position of the reception signal; and
detecting the information vector by decoding the zero inserted signal using the 2nd parity check matrix,
when the degree of a column of the 1st information part is greater than the degree of a column of the 2nd information part, and a code rate to be used in the signal transmission apparatus is a 3rd code rate,
wherein the 3rd code rate is less than the 2nd code rate.

59. The method of claim 58, further comprising:
inserting zero into a predetermined position of the reception signal; and
detecting the information vector by decoding the zero inserted signal using the 1st parity check matrix,
when the degree of a column of the 1st information part is greater than the degree of a column of the 2nd information part, and a code rate to be used in the signal transmission apparatus is the 4th code rate,
wherein the 4th code rate is less than the 1st code rate, and greater than the 2nd code rate.

60. An apparatus to decode a block Low Density Parity Check (LDPC) code in a signal reception apparatus, the apparatus comprising:
a decoder to detect an information vector by decoding as a code rate of a 1st parity check matrix a reception signal using the 1$^{st}$ parity check matrix when a code rate used in a signal transmission apparatus is a 1$^{st}$ code rate, and detect the information vector by decoding as a code rate of a 2$^{nd}$ parity check matrix the reception signal using the 2$^{nd}$ parity check matrix when a code rate used in the signal transmission apparatus is a 2$^{nd}$ code rate, wherein the 1$^{st}$ parity check matrix is generated using a 2$^{nd}$ parity check matrix, the 2$^{nd}$ parity check matrix includes a plurality of blocks, the plurality of blocks are classified into blocks corresponding to an information part corresponding to the information vector, blocks corresponding to a 1$^{st}$ parity part corresponding to a 1$^{st}$ parity vector, blocks corresponding to a 2$^{nd}$ parity part corresponding to a 2$^{nd}$ parity vector, and blocks corresponding to a 3$^{rd}$ parity part corresponding to a 3$^{rd}$ parity vector, wherein when the information vector includes a 1$^{st}$ information vector and a 2$^{nd}$ information vector, the blocks classified as the information part are classified into blocks corresponding to a 1$^{st}$ information part corresponding to the 1$^{st}$ information vector and blocks corresponding to a 2$^{nd}$ information part corresponding to the 2$^{nd}$ information vector, wherein the blocks classified as the 1$^{st}$ information part are classified into blocks corresponding to a 1$^{st}$ partial block, blocks corresponding to a 2$^{nd}$ partial block, and blocks corresponding to a 3$^{rd}$ partial block, wherein the blocks classified as the 2$^{nd}$ information part are classified into blocks corresponding to a 4$^{th}$ partial block, blocks corresponding to a 5$^{th}$ partial block, and blocks corresponding to a 6$^{th}$ partial block, wherein the blocks classified as the 1$^{st}$ parity part are classified into blocks corresponding to a 7$^{th}$ partial block, blocks corresponding to a 8$^{th}$ partial block, and blocks corresponding to a 9$^{th}$ partial block, wherein the blocks classified as the 2$^{nd}$ parity part are classified into blocks corresponding to a 10$^{th}$ partial block, blocks corresponding to a 11$^{th}$ partial block, and blocks corresponding to a 12$^{th}$ partial block, wherein the blocks classified as the 3$^{rd}$ parity part are classified into blocks corresponding to a 13$^{th}$ partial block, blocks corresponding to a 14$^{th}$ partial block, and blocks corresponding to a 15$^{th}$ partial block, and wherein the 15$^{th}$ partial block is diagonal with the 11$^{th}$ partial block block-by-block, identity matrixes are arranged in blocks corresponding to the 15$^{th}$ partial block.

61. The apparatus of claim 60, wherein non-zero matrixes are arranged in blocks corresponding to the 3$^{rd}$ partial block, and blocks corresponding to the 6$^{th}$ partial block, and zero matrixes are arranged in blocks corresponding to the 9$^{th}$ partial block, blocks corresponding to the 12$^{th}$ partial block, blocks corresponding to the 13$^{th}$ partial block, and blocks corresponding to the 14$^{th}$ partial block.

62. The apparatus of claim 60, wherein non-zero matrixes are arranged in blocks corresponding to the 3$^{rd}$ partial block, blocks corresponding to the 6$^{th}$ partial block, blocks corresponding to the 9$^{th}$ partial block, blocks corresponding to the 12$^{th}$ partial block, blocks corresponding to the 13$^{th}$ partial block, and blocks corresponding to the 14$^{th}$ partial block.

63. The apparatus of claim 60, wherein the 1$^{st}$ parity check matrix includes the 2$^{nd}$ parity check matrix, a plurality of blocks included in the 1$^{st}$ parity check matrix are classified into blocks corresponding to the 1$^{st}$ information part, blocks corresponding to the 2$^{nd}$ information part, blocks corresponding to the 1$^{st}$ parity part, blocks corresponding to the 2$^{nd}$ parity part, blocks corresponding to the 3$^{rd}$ parity part, and blocks corresponding to a 4$^{th}$ parity part corresponding to a 4$^{th}$ parity vector, wherein the blocks classified as the 1$^{st}$ information part are classified into blocks corresponding to the 1$^{st}$ partial block, the 2$^{nd}$ partial block, and the 3$^{rd}$ partial block, and blocks corresponding to a 16$^{th}$ partial block, wherein the blocks classified as the 2$^{nd}$ information part are classified into blocks corresponding to the 4$^{th}$ partial block, the 5$^{th}$ partial block, and the 6$^{th}$ partial block, and blocks corresponding to a 17$^{th}$ partial block, wherein the blocks classified as the 1$^{st}$ parity part are classified into blocks corresponding to the 7$^{th}$ partial block, the 8$^{th}$ partial block, and the 9$^{th}$ partial block, and blocks corresponding to a 18$^{th}$ partial block, wherein the blocks classified as the 2$^{nd}$ parity part are classified into blocks corresponding to the 10$^{th}$ partial block, the 11$^{th}$ partial block, and the 12$^{th}$ partial block, and blocks corresponding to a 19$^{th}$ partial block, wherein the blocks classified as the 3$^{rd}$ parity part are classified into blocks corresponding to the 13$^{th}$ partial block, the 14$^{th}$ partial block, and the 15$^{th}$ partial block, and blocks corresponding to a 20$^{th}$ partial block, wherein the blocks classified as the 4$^{th}$ parity part are classified into blocks corresponding to a 21$^{th}$ partial block, blocks corresponding to a 22$^{th}$ partial block, blocks corresponding to a 23$^{th}$ partial block, and blocks corresponding to a 24$^{th}$ partial block, and wherein the 24$^{th}$ partial block is diagonal with the 15$^{th}$ partial block block-by-block, identity matrixes are arranged in blocks corresponding to the 24$^{th}$ partial block.

64. The apparatus of claim 63, wherein non-zero matrixes are arranged in blocks corresponding to the 3$^{rd}$ partial block, blocks corresponding to the 6$^{th}$ partial block, blocks corresponding to the 16$^{th}$ partial block, and blocks corresponding to the 17$^{th}$ partial block, and zero matrixes are arranged in blocks corresponding to the 9$^{th}$ partial block, blocks corresponding to the 12$^{th}$ partial block, blocks corresponding to the 13$^{th}$ partial block, blocks corresponding to the 14$^{th}$ partial block, blocks corresponding to the 18$^{th}$ partial block, blocks corresponding to the 19$^{th}$ partial block, blocks corresponding to the 20$^{th}$ partial block, blocks corresponding to the 21$^{th}$ partial block, and blocks corresponding to the 22$^{th}$ partial block, blocks corresponding to the 23$^{rd}$ partial block.

65. The apparatus of claim 63, wherein non-zero matrixes are arranged in blocks corresponding to the 3$^{rd}$ partial block, blocks corresponding to the 6$^{th}$ partial block, blocks corresponding to the 16$^{th}$ partial block, blocks corresponding to the 17$^{th}$ partial block, blocks corresponding to the 9$^{th}$ partial block, blocks corresponding to the 12$^{th}$ partial block, blocks corresponding to the 13$^{th}$ partial block, blocks corresponding to the 14$^{th}$ partial block, blocks corresponding to the 18$^{th}$ partial block, blocks corresponding to the 19$^{th}$ partial block, blocks corresponding to the 20$^{th}$ partial block, blocks corresponding to the 21$^{th}$ partial block, blocks corresponding to the 22$^{th}$ partial block, and blocks corresponding to the 23$^{th}$ partial block.

66. The apparatus of claim 60, wherein a degree of a column of the 1$^{st}$ information part is different from a degree of a column of the 2$^{nd}$ information part.

67. The apparatus of claim 66, wherein the decoder inserts zero into a predetermined position of the reception signal, and detects the information vector by decoding the zero inserted signal using the 2$^{nd}$ parity check matrix, when the degree of a column of the 1$^{st}$ information part is greater than the degree of a column of the 2$^{nd}$ information part, and a code rate to be used in the signal transmission apparatus is a $3^{rd}$ code rate, wherein the $3^{rd}$ code rate is less than the $2^{nd}$ code rate.

68. The apparatus of claim 66, wherein the decoder inserts zero into a predetermined position of the reception signal, and detects the information vector by decoding the zero inserted signal using the $1^{st}$ parity check matrix, when the degree of a column of the $1^{st}$ information part is greater than the degree of a column of the $2^{nd}$ information part, and a code rate to be used in the signal transmission apparatus is the $4^{th}$ code rate, wherein the $4^{th}$ code rate is less than the $1^{st}$ code rate, and greater than the $2^{nd}$ code rate.

69. An apparatus to decode a block Low Density Parity Check (LDPC) code in a signal reception apparatus, the apparatus comprising:

a decoder to detect an information vector by decoding as a code rate of a $1^{st}$ parity check matrix a reception signal using the $1^{st}$ parity check matrix when a code rate used in a signal transmission apparatus is a $1^{st}$ code rate, and detect the information vector by decoding as a code rate of a $2^{nd}$ check matrix the reception signal using the $2^{nd}$ parity check matrix when a code rate used in the signal transmission apparatus is a $2^{nd}$ code rate, wherein when the information vector includes a $1^{st}$ information vector and a $2^{nd}$ information vector, the blocks classified as the information part are classified into blocks corresponding to a $1^{st}$ information part corresponding to the $1^{st}$ information vector and blocks corresponding to a $2^{nd}$ information part corresponding to the $2^{nd}$ information vector, wherein the blocks classified as the $1^{st}$ information part are classified into blocks corresponding to a $1^{st}$ partial block, and blocks corresponding to a $2^{nd}$ partial block, wherein the blocks classified as the $2^{nd}$ information part are classified into blocks corresponding to a $3^{rd}$ partial block, and blocks corresponding to a $4^{th}$ partial block, wherein the blocks classified as the $1^{st}$ parity part are classified into blocks corresponding to a $5^{th}$ partial block, and blocks corresponding to a $6^{th}$ partial block, and wherein the blocks classified as the $2^{nd}$ parity part are classified into blocks corresponding to a $7^{th}$ partial block, and blocks corresponding to a $8^{th}$ partial block.

70. The apparatus of claim 69, wherein the $1^{st}$ parity check matrix includes the $2^{nd}$ parity check matrix, a plurality of blocks included in the $1^{st}$ parity check matrix are classified into blocks corresponding to the $1^{st}$ information part, blocks corresponding to the $2^{nd}$ information part, blocks corresponding to the $1^{st}$ parity part, blocks corresponding to the $2^{nd}$ parity part, and blocks corresponding to the $3^{rd}$ parity part, wherein the blocks classified as the $1^{st}$ information part are classified into blocks corresponding to the $1^{st}$ partial block and the $2^{nd}$ partial block, and blocks corresponding to a $9^{th}$ partial block, wherein the blocks classified as the $2^{nd}$ information part are classified into blocks corresponding to the $3^{rd}$ partial block and the $4^{th}$ partial block, and blocks corresponding to a $10^{th}$ partial block, wherein the blocks classified as the $1^{st}$ parity part are classified into blocks corresponding to the $5^{th}$ partial block and the $6^{th}$ partial block, and blocks corresponding to a $11^{th}$ partial block, wherein the blocks classified as the $2^{nd}$ parity part are classified into blocks corresponding to the $7^{th}$ partial block and the $8^{th}$ partial block, and blocks corresponding to a $12^{th}$ partial block, wherein the blocks classified as the $3^{rd}$ parity part are classified into blocks corresponding to the $13^{th}$ partial block and the $14^{th}$ partial block, and blocks corresponding to a $15^{th}$ partial block, wherein the $15^{th}$ partial block is diagonal with the $8^{th}$ partial block block-by-block, identity matrixes are arranged in blocks corresponding to the $15^{th}$ partial block.

71. The apparatus of claim 69, wherein non-zero matrixes are arranged in blocks corresponding to the $9^{th}$ partial block, and blocks corresponding to the $10^{th}$ partial block, and zero matrixes are arranged in blocks corresponding to the $11^{th}$ partial block, blocks corresponding to the $12^{th}$ partial block, blocks corresponding to the $13^{th}$ partial block, and blocks corresponding to the $14^{th}$ partial block.

72. The apparatus of claim 69, wherein non-zero matrixes are arranged in blocks corresponding to the $9^{th}$ partial block, blocks corresponding to the $10^{th}$ partial block, blocks corresponding to the $11^{th}$ partial block, blocks corresponding to the $12^{th}$ partial block, blocks corresponding to the $13^{th}$ partial block, and blocks corresponding to the $14^{th}$ partial block.

73. The apparatus of claim 69, wherein a degree of a column of the $1^{st}$ information part is different from a degree of a column of the $2^{nd}$ information part.

74. The apparatus of claim 73, wherein the decoder inserts zero into a predetermined position of the reception signal, and detects the information vector by decoding the zero inserted signal using the $2^{nd}$ parity check matrix, when the degree of a column of the $1^{st}$ information part is greater than the degree of a column of the $2^{nd}$ information part, and a code rate to be used in the signal transmission apparatus is a $3^{rd}$ code rate, wherein the $3^{rd}$ code rate is less than the $2^{nd}$ code rate.

75. The apparatus of claim 73, wherein the decoder inserts zero into a predetermined position of the reception signal, and detects the information vector by decoding the zero inserted signal using the $1^{st}$ parity check matrix, when the degree of a column of the $1^{st}$ information part is greater than the degree of a column of the $2^{nd}$ information part, and a code rate to be used in the signal transmission apparatus is the $4^{th}$ code rate, wherein the $4^{th}$ code rate is less than the $1^{st}$ code rate, and greater than the $2^{nd}$ rate.

* * * * *